US012690155B2

(12) United States Patent
Narayanan et al.

(10) Patent No.: US 12,690,155 B2
(45) Date of Patent: Jul. 21, 2026

(54) PENTA-PORT-CAGE SYSTEM

(71) Applicant: Dell Products L.P., Round Rock, TX (US)

(72) Inventors: Padmanabhan Narayanan, Chennai (IN); Shree Rathinasamy, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 129 days.

(21) Appl. No.: 18/655,681

(22) Filed: May 6, 2024

(65) Prior Publication Data

US 2025/0344336 A1      Nov. 6, 2025

(51) Int. Cl.
*H05K 7/14*          (2006.01)
*H01R 13/518*          (2006.01)
(52) U.S. Cl.
CPC ......... *H05K 7/1491* (2013.01); *H01R 13/518* (2013.01); *H05K 7/1492* (2013.01); *H05K 7/1498* (2013.01)
(58) Field of Classification Search
None
See application file for complete search history.

(56) References Cited

U.S. PATENT DOCUMENTS

| | | | | |
|---|---|---|---|---|
| 10,888,011 B2 * | 1/2021 | Morris | ................. | H05K 7/1459 |
| 2012/0306434 A1 * | 12/2012 | Sassen | .................... | H02J 7/731 |
| | | | | 320/162 |
| 2015/0194829 A1 * | 7/2015 | Smeja | ....................... | H02J 7/70 |
| | | | | 320/107 |
| 2023/0221510 A1 * | 7/2023 | Goergen | .............. | G02B 6/4261 |
| | | | | 361/709 |

* cited by examiner

*Primary Examiner* — Oscar C Jimenez
(74) *Attorney, Agent, or Firm* — Joseph Mencher

(57) ABSTRACT

A penta-port-cage system includes a first port cage. A pair of second port cages on the penta-port-cage system are each connected to the first port cage opposite the first port cage from each other, are each oriented such that they are rotated about their longitudinal axis relative to the first port cage, and are inverted relative to each other. A pair of third port cages on the penta-port-cage system are each connected to the first port cage opposite the first port cage from each other, are each oriented such that they are rotated about their longitudinal axis relative to the first port cage, and are inverted relative to each other. Each of the first port cages, the pair of second port cages, and the pair of third port cages are configured to couple cabling systems to a processing system in a networking device.

20 Claims, 27 Drawing Sheets

602

COMMUNICATION SYSTEM 608

NETWORKING ENGINE 604

NETWORKING DATABASE 606

NETWORKING DEVICE 600

NETWORKING DEVICE 700

NETWORKING DEVICE 700

204

210

702

900

910

902

900

910

902

910

1200

1200

1200

1200

PENTA-PORT-CAGE SYSTEM

BACKGROUND

The present disclosure relates generally to information handling systems, and more particularly to a port cage for information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, switch devices or other networking devices known in the art, include a plurality of ports and are typically provided in racks with computing devices coupled to their ports in order to allow the networking devices to transmit data between those computing devices. In general, the size of racks and the "Rack Units" (RUs) defined by those racks for use in housing devices is relatively constant, and operates to constrain the allowable dimensions of a networking device that will be used in the rack (e.g., most conventional racks include a 1 RU width of approximately 19 inches). In turn, this constrains the number of ports that may be provided on such networking devices (e.g., networking devices like the POWERSWITCH® S5232F-ON available from DELL® Inc. of Round Rock, Texas, United States that includes 32 Quad Small Form-factor Pluggable 28 (QSFP28) ports that are accessible on its front surface). Such limitations in port density on conventional networking devices can raise issues.

For example, in the event the ports on a networking device in a rack are fully populated and a network administrator or other user requires further connectivity, an additional networking device must be provided, and an RU in the rack must be available (or must be made available). With connectivity requirements steadily increasing (e.g., in hyperscale datacenters, edge datacenters, etc.), available RUs in racks are relatively scarce, and the provisioning of additional networking devices increases capital expenditures, operational expenditures, and other costs that would be apparent to one of skill in the art.

Accordingly, it would be desirable to provide networking devices that address the issues discussed above.

SUMMARY

According to one embodiment, an Information Handling System (IHS) includes a device chassis; a processing system that is housed in the device chassis; and a communication system that is housed in the device chassis, that is coupled to the processing system, and that includes a plurality of penta-port-cage systems, wherein each penta-port-cage system includes: a first port cage that is accessible on a surface of the device chassis; a pair of second port cages that are each accessible on the surface of the device chassis, that are each connected to the first port cage opposite the first port cage from each other, that are each oriented such that they are rotated about their longitudinal axis relative to the first port cage, and that are inverted relative to each other; and a pair of third port cages that are each accessible on the surface of the device chassis, that are each connected to the first port cage opposite the first port cage from each other, that are each oriented such that they are rotated about their longitudinal axis relative to the first port cage, and that are inverted relative to each other.

BRIEF DESCRIPTION OF THE DRAWINGS

FIG. 6 is a schematic view illustrating an embodiment of a networking device that may include the penta-port-cage system of FIG. 2 or 3.

FIG. 11D is a side view illustrating an embodiment of cabling systems connected to the plurality of the transceiver devices connected to perimeter port cages on the penta-port system on the networking device of FIG. 11C.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
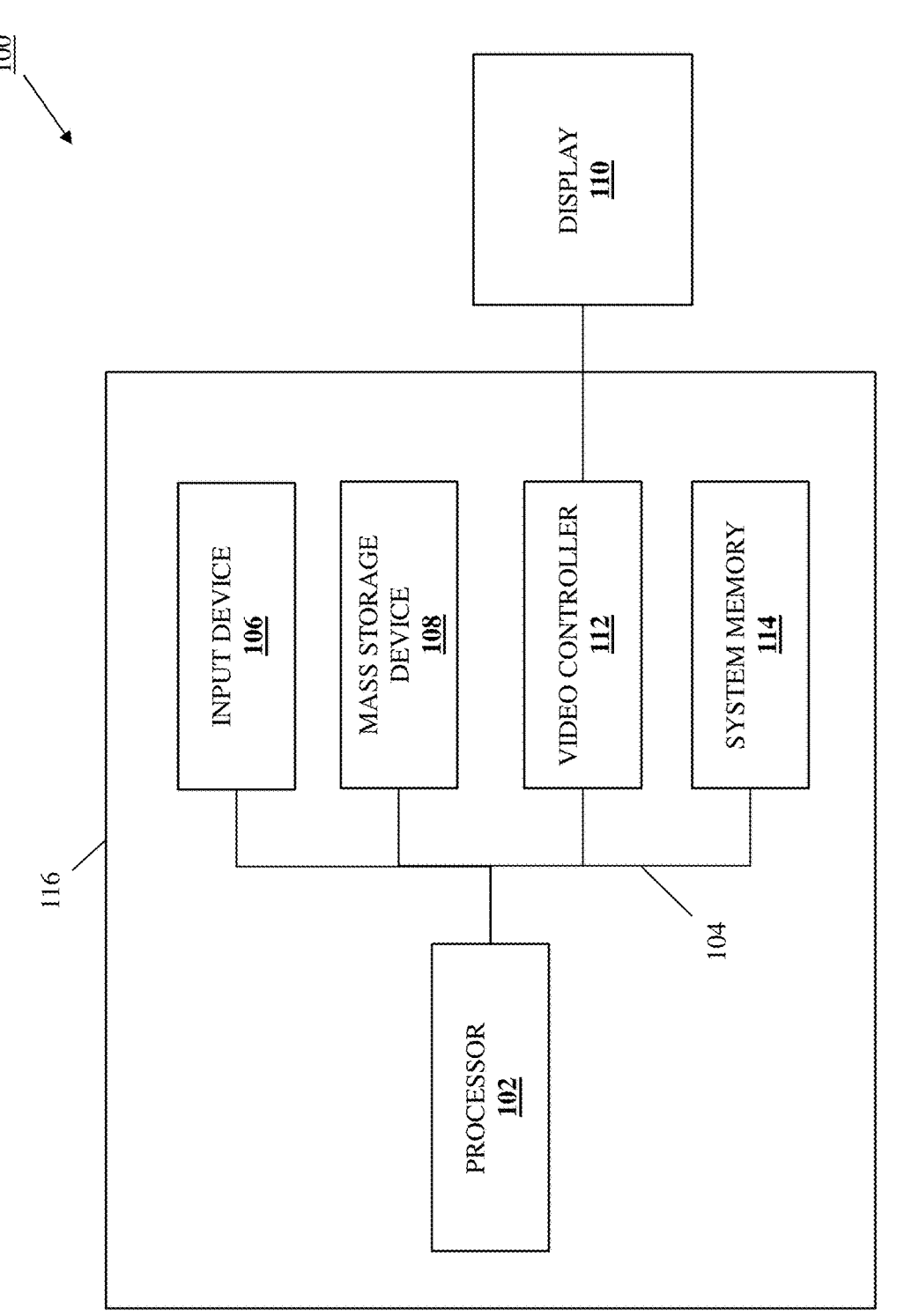
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
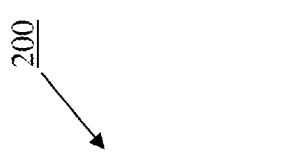
FIG. 2 is a perspective view illustrating an embodiment of a penta-port-cage system that may be provided according to the teachings of the present disclosure.
Figure 2:

Referring now to FIG. 2, an embodiment of a penta-port-cage system 200 is illustrated that may be provided according to the teachings of the present disclosure. In the illustrated embodiment, the penta-port-cage system 200 includes a "central" port cage 202 that defines a port cage housing 202a along its length that is assessable via a port cage housing entrance 202b, and that houses a port connector 202c. The penta-port-cage system 200 also includes a "perimeter" port cage 204 that includes a pair of port cage side surfaces 204a and 204b, that defines a port cage housing 204c along its length that is assessable via a port cage housing entrance 204d, and that houses a port connector 204c.

The penta-port-cage system 200 also includes a "perimeter" port cage 206 that includes a pair of port cage side surfaces 206a and 206b, that defines a port cage housing 206c along its length that is assessable via a port cage housing entrance 206d, and that houses a port connector 206c. The penta-port-cage system 200 also includes a "perimeter" port cage 208 that includes a pair of port cage side surfaces 208a and 208b, that defines a port cage housing 208c along its length that is assessable via a port cage housing entrance 208d, and that houses a port connector 208c. The penta-port-cage system 200 also includes a "perimeter" port cage 210 that includes a pair of port cage side surfaces 210a and 210b, that defines a port cage housing 210c along its length that is assessable via a port cage housing entrance 210d, and that houses a port connector 210c.

In the examples provided below, the "central" port cage 202 and the "perimeter" port cages 204-210 are provided by Quad Small Form-factor Pluggable (QSFP) port cages that are configured to connect to QSFP transceiver devices to couple to cabling systems via the QSFP transceiver devices, but one of skill in the art in possession of the present disclosure will appreciate how the "central" port cage 202 and the "perimeter" port cages 204-210 may be configured to connect directly to any of a variety of cabling systems (e.g., Ethernet port cages that are configured to connect directly to Ethernet cable connectors on Ethernet cabling systems) or to couple to cabling systems via any of a variety of other intermediate devices while remaining within the scope of the present disclosure as well.

In the specific example illustrated in FIG. 2A, each corner of the "central" port cage 202 is connected to each of the "perimeter" port cages 204-210 along its length, and one of skill in the art in possession of the present disclosure will appreciate how those connections may be provided using welds, adhesives, fasteners, and/or other connection techniques known in the art. Furthermore, respective corners of the "perimeter" port cage 204 and the "perimeter" port cage 206 are connected along their length, respective corners of the "perimeter" port cage 206 and the "perimeter" port cage 208 are connected along their length, respective corners of the "perimeter" port cage 208 and the "perimeter" port cage 210 are connected along their length, and respective corners of the "perimeter" port cage 210 and the "perimeter" port cage 204 are connected along their length, and one of skill in the art in possession of the present disclosure will appreciate how those connections may be provided using welds, adhesives, fasteners, and/or other connection techniques known in the art.

As will be appreciated by one of skill in the art in possession of the present disclosure, the penta-port-cage system 200 illustrated in FIG. 2A defines a "top" airflow channel between the "central" port cage 202 and the "perimeter" port cages 204 and 206 (i.e., an airflow channel that extends through the penta-port-cage system 200 adjacent a "top" of the "central" port cage 202); a "right side" airflow channel between the "central" port cage 202 and the "perimeter" port cages 206 and 208 (i.e., an airflow channel that extends through the penta-port-cage system 200 adjacent a "right side" of the "central" port cage 202); a "bottom" airflow channel between the "central" port cage 202 and the "perimeter" port cages 208 and 210 (i.e., an airflow channel that extends through the penta-port-cage system 200 adjacent a "bottom" of the "central" port cage 202); and a "left side" airflow channel between the "central" port cage 202 and the "perimeter" port cages 204 and 210 (i.e., an airflow channel that extends through the penta-port-cage system 200 adjacent a "left side" of the "central" port cage 202).

In the illustrated embodiment, a pair of device chassis mounting members 212 extend from each of the "perimeter" port cages 204, 206, 208, and 210, with each pair of device chassis mounting members 212 extending from its respective "perimeter" port cage in a spaced apart configuration from each other. As described below, the device chassis mounting members 212 may be configured in a variety of manners and may include any of a variety of mounting features for mounting the penta-port-cage system 200 to a device chassis as described below. However, while a specific penta-port-cage system 200 has been illustrated and described, one of skill in the art in possession of the present disclosure will recognize that the penta-port-cage system of the present disclosure may include a variety of components and component configurations while remaining within the scope of the present disclosure as well.

Figure 3:
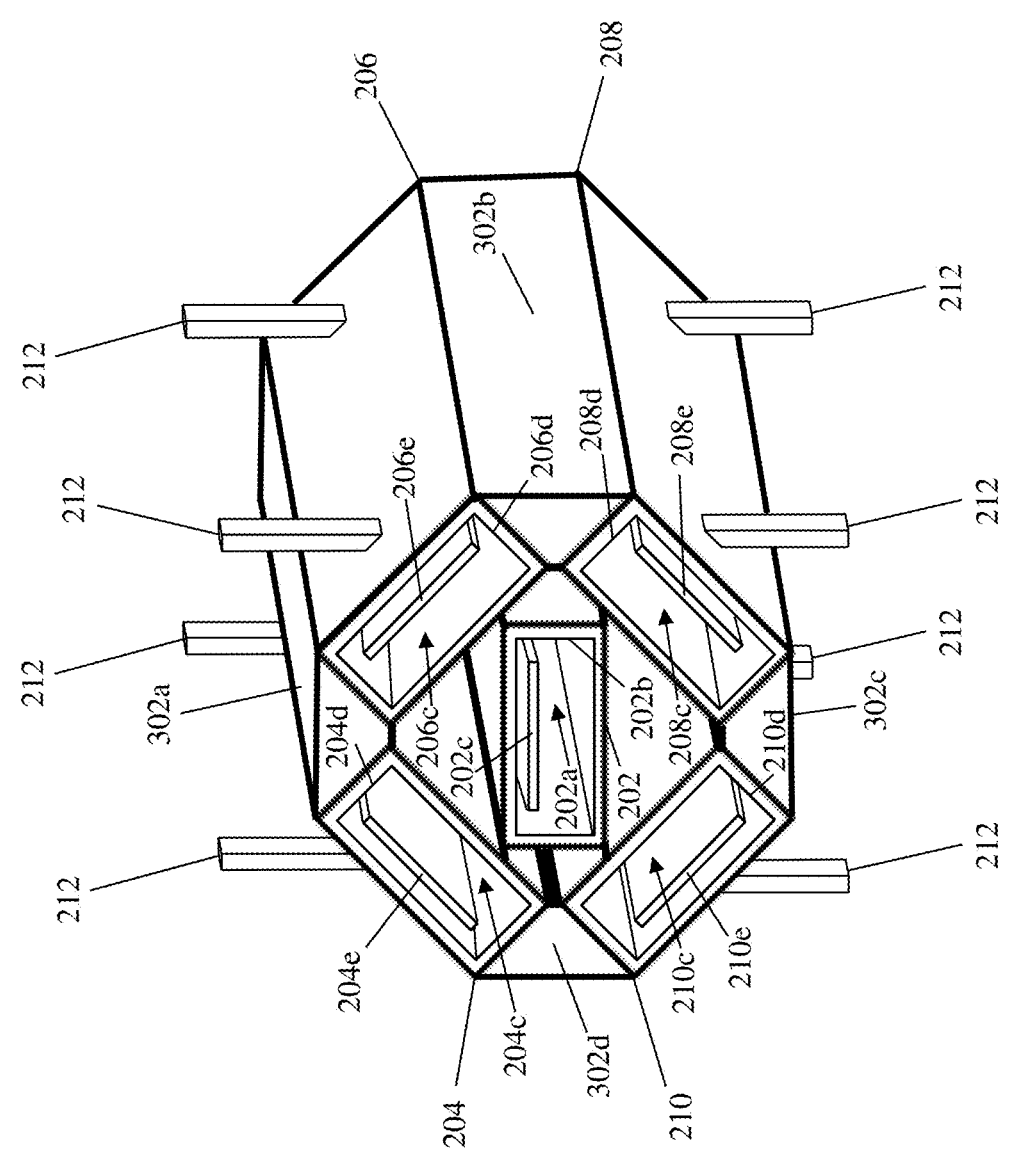
FIG. 3 is a perspective view illustrating an embodiment of a penta-port-cage system that may be provided according to the teachings of the present disclosure.

For example, referring now to FIG. 3, an embodiment of a penta-port-cage system 300 is illustrated that may be provided according to the teachings of the present disclosure. In the illustrated embodiment, the penta-port-cage system 300 is similar to the penta-port-cage system 200 discussed above with reference to FIG. 2 (with similar elements provided with the same element numbers), but includes structural support elements that are configured to provide additional support and strength to the penta-port-cage system 300. In the illustrated embodiment, a structural support element 302a extends between the side surfaces 204b and 206b of the "perimeter" port cages 204 and 206, respectively, and along their lengths; a structural support element 302b extends between the side surfaces 206a and 208a of the "perimeter" port cages 206 and 208, respectively, and along their lengths; a structural support element 302c extends between the side surfaces 208b and 210b of the "perimeter" port cages 208 and 210, respectively, and along their lengths; and a structural support element 302d extends between the side surfaces 210a and 204a of the "perimeter" port cages 210 and 204, respectively, and along their lengths. As such, a wide variety of components for and/or configurations of the penta-port-cage system are envisioned as falling within the scope of the present disclosure.

Figure 4:
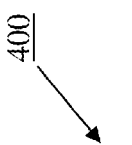
FIG. 4 is a perspective view of an embodiment of a port cage that may be provided in the penta-port-cage system of FIG. 2 or 3.
Figure 4:

With reference to FIG. 4, an embodiment of a port cage 400 is illustrated for purposes of describing the relative orientations of the port cages in the penta-port-cage systems 200 and 300 discussed above. As can be seen, the port cage 400 includes a port cage chassis 402 having a top wall 402a, a bottom wall 402b that is located opposite the port cage chassis 402 from the top wall 402a, and a pair of side walls 402c and 402d that are located opposite the port cage chassis 402 from each other and that extend between the top wall 402a and the bottom wall 402b. A port cage housing 404 is defined between the top wall 402a, the bottom wall 402b, and the side walls 402c and 402d, and includes a port cage entrance 404a that provides access to the port cage housing 404. A port connector 406 is located adjacent the top wall 402a of the port cage housing 402. As can be seen in FIG. 4, a plurality of axes may be defined for the port cage 400 in the orientation illustrated in FIG. 4, with an X-axis provided along a "width" of the port cage 400, a Y-axis provided along a "height" of the port cage 400, and a Z-axis provided along a "length" of the port cage 400. In the examples provided below, the Z-axis is referred to as a "longitudinal axis" of the port cage 400 about which the port cage 400 may be rotated to provide the different orientations of port cages provided in the penta-port-cage system of the present disclosure.

Figure 5:
FIG. 5 is a schematic view of an embodiment of a relative orientations of port cages of FIG. 4 provided in the penta-port-cage system of FIG. 2 or 3.
Figure 5:
Figure 5:
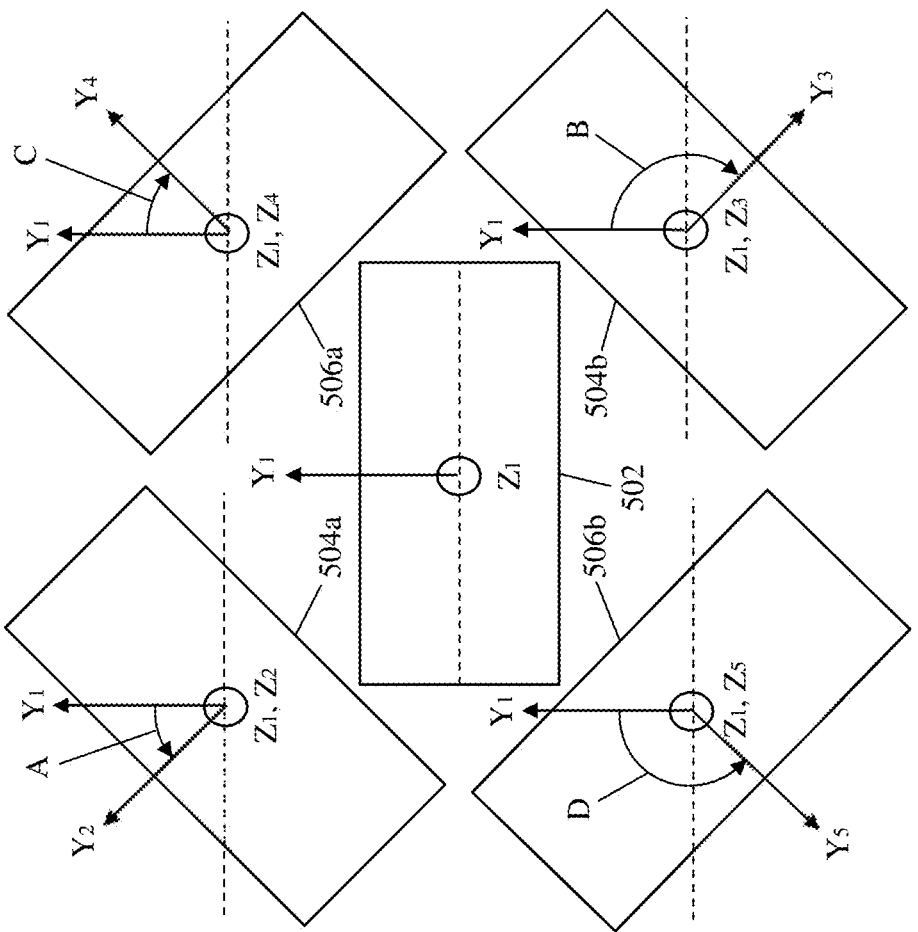

For example, FIG. 5 illustrates a penta-port-cage system 500 including first port cage 502 (i.e., the "central" port cage 202 in the penta-port-cage systems 200 and 300 discussed above) that provides a "reference" port cage in the discussion of the relative orientations of the other port cages (i.e., the "perimeter" port cages 204-210 in the penta-port-cage systems 200 and 300 discussed above) in the penta-port-cage system 500. As will be appreciated by one of skill in the art in possession of the present disclosure, the first port cage 502 may be provided by the port cage 400 discussed above with reference to FIG. 4, and includes a "first" Y-axis $Y_1$, as well as a "first" longitudinal axis $Z_1$ (i.e., the Z-axis of the port cage 400 in FIG. 4) extending from the page in FIG. 5.

As illustrated, the penta-port-cage system 500 also includes a pair of second port cages 504a and 504b (i.e., the "perimeter" port cages 204 and 208 in the penta-port-cage systems 200 and 300 discussed above) that are each connected to the first port cage 502 opposite the first port cage 502 from each other as described above with reference to FIGS. 2 and 3. As will be appreciated by one of skill in the art in possession of the present disclosure, the second port cage 504a may be provided by the port cage 400 discussed above with reference to FIG. 4, and includes a "second"

Y-axis $Y_2$, as well as a "second" longitudinal axis $Z_2$ (i.e., the Z-axis of the port cage 400 in FIG. 4) extending from the page in FIG. 5. As can be seen in FIG. 5 (which superimposes the "first" longitudinal axis $Z_1$ and the "first" Y-axis $Y_1$ of the first port cage 502 having the orientation of the first port cage 502 in FIG. 5A over the second port cage 504a so that the "first" longitudinal axis $Z_1$ is aligned with the "second" longitudinal axis $Z_1$), the second port cage 504a is oriented such that it is rotated about the "second" longitudinal axis $Z_2$ of the second port cage 504a relative to the first port cage 502 by an angle A (i.e., between the "first" Y-axis $Y_1$ of the first port cage 502 and the "second" Y-axis $Y_2$ of the second port cage 504a).

As will also be appreciated by one of skill in the art in possession of the present disclosure, the second port cage 504b may be provided by the port cage 400 discussed above with reference to FIG. 4, and includes a "third" Y-axis $Y_3$, as well as a "third" longitudinal axis $Z_3$ (i.e., the Z-axis of the port cage 400 in FIG. 4) extending from the page in FIG. 5. As can be seen in FIG. 5 (which superimposes the "first" longitudinal axis $Z_1$ and the "first" Y-axis $Y_1$ of the first port cage 502 having the orientation of the first port cage 502 in FIG. 5A over the second port cage 504b so that the "first" longitudinal axis $Z_1$ is aligned with the "third" longitudinal axis $Z_3$), the second port cage 504b is oriented such that it is rotated about the "third" longitudinal axis $Z_3$ of the second port cage 504b relative to the first port cage 502 by an angle B (i.e., between the "first" Y-axis $Y_1$ of the first port cage 502 and the "third" Y-axis $Y_3$ of the second port cage 504b), which one of skill in the art in possession of the present disclosure will appreciate provides the second port cages 504a and 504b inverted relative to each other on opposite sides of the first port cage 502.

The penta-port-cage system 500 also includes a pair of third port cages 506a and 506b (i.e., the "perimeter" port cages 206 and 210 in the penta-port-cage systems 200 and 300 discussed above) that are each connected to the first port cage 502 opposite the first port cage 502 from each other as described above with reference to FIGS. 2 and 3. As will be appreciated by one of skill in the art in possession of the present disclosure, the third port cage 506a may be provided by the port cage 400 discussed above with reference to FIG. 4, and includes a "fourth" Y-axis $Y_4$, as well as a "fourth" longitudinal axis $Z_4$ (i.e., the Z-axis of the port cage 400 in FIG. 4) extending from the page in FIG. 5. As can be seen in FIG. 5 (which superimposes the "first" longitudinal axis $Z_1$ and the "first" Y-axis $Y_1$ of the first port cage 502 having the orientation of the first port cage 502 in FIG. 5A over the third port cage 506a so that the "first" longitudinal axis $Z_1$ is aligned with the "fourth" longitudinal axis $Z_4$), the third port cage 506a is oriented such that it is rotated about the "fourth" longitudinal axis $Z_4$ of the third port cage 506a relative to the first port cage 502 by an angle C (i.e., between the "first" Y-axis $Y_1$ of the first port cage 502 and the "fourth" Y-axis $Y_4$ of the third port cage 506a).

As will also be appreciated by one of skill in the art in possession of the present disclosure, the third port cage 506b may be provided by the port cage 400 discussed above with reference to FIG. 4, and includes a "fifth" Y-axis $Y_5$, as well as a "fifth" longitudinal axis $Z_5$ (i.e., the Z-axis of the port cage 400 in FIG. 4) extending from the page in FIG. 5. As can be seen in FIG. 5 (which superimposes the "first" longitudinal axis $Z_1$ and the "first" Y-axis $Y_1$ of the first port cage 502 having the orientation of the first port cage 502 in FIG. 5 over the third port cage 506b so that the "first" longitudinal axis $Z_1$ is aligned with the "fifth" longitudinal axis $Z_5$), the third port cage 506b is oriented such that it is rotated about the "fifth" longitudinal axis $Z_5$ of the third port cage 506b relative to the first port cage 502 by an angle D (i.e., between the "first" Y-axis $Y_1$ of the first port cage 502 and the "fifth" Y-axis $Y_5$ of the third port cage 506b), which one of skill in the art in possession of the present disclosure will appreciate provides the third port cages 506a and 506b inverted relative to each other on opposite sides of the first port cage 502.

As such, some embodiments of the present disclosure provide the second port cage 504a and the third port cage 506a oriented such that they are each rotated by the same first angle about their longitudinal axis $Z_2$ and $Z_4$, respectively, relative to the first port cage 502 but in opposite directions, and provide the second port cage 504b and the third port cage 506b oriented such that they are each rotated by the same second angle about their longitudinal axis $Z_3$ and $Z_5$, respectively, relative to the first port cage 502 but in opposite directions. However, while an example having specific details of the orientations of port cages in the penta-port-cage system of the present disclosure have been illustrated and described, one of skill in the art in possession of the present disclosure will appreciate how other orientations of the port cages in the penta-port-cage systems of the present disclosure will fall within the scope of the present disclosure ss well.

Figure 6:
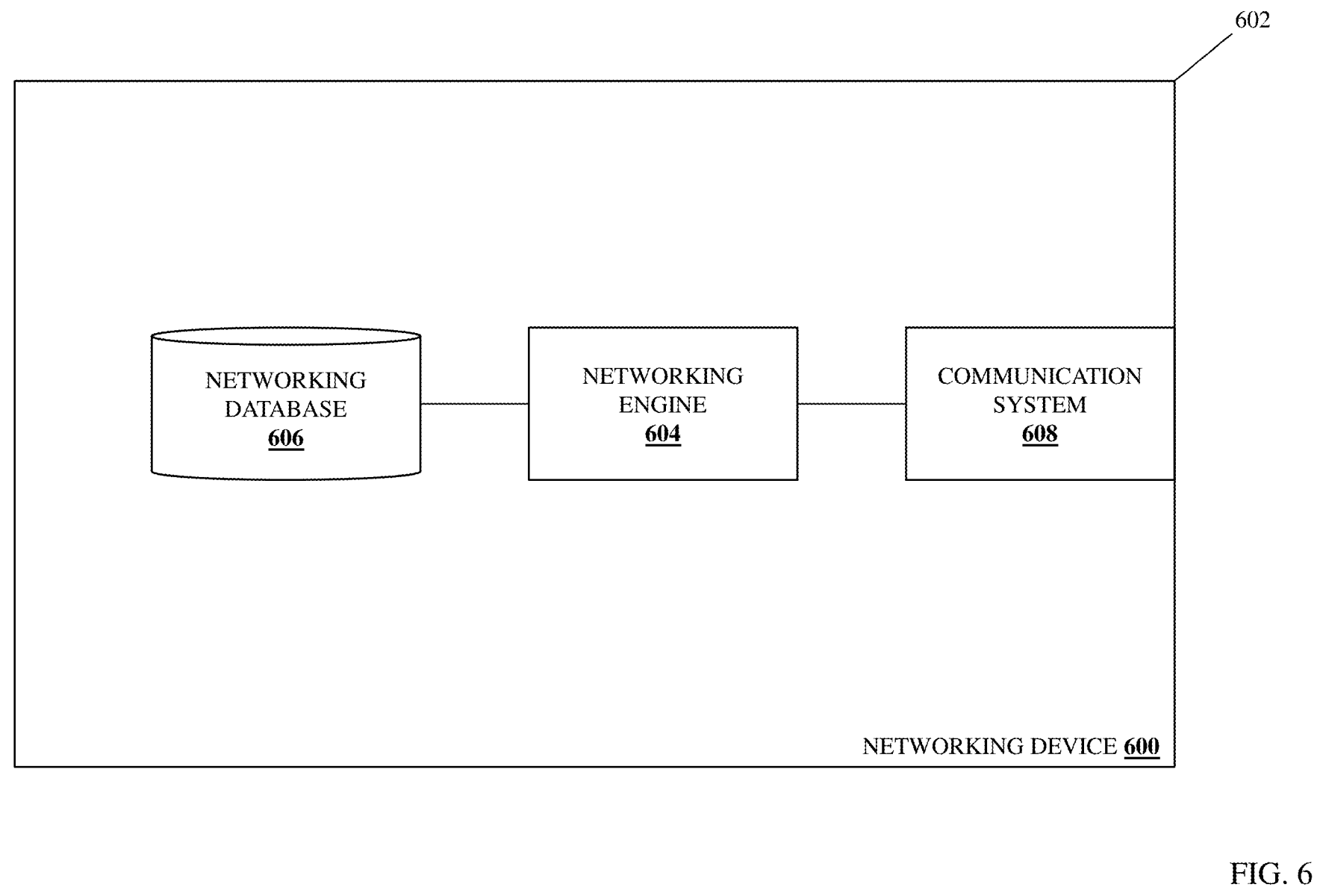

Referring now to FIG. 6, an embodiment of a networking device 600 is illustrated that may utilize the penta-port-cage systems 200 or 300 discussed above with reference to FIGS. 2 and 3. In an embodiment, the networking device 600 may be provided by the IHS 100 discussed above with reference to FIG. 1 and/or may include some or all of the components of the IHS 100 and in specific examples may be provided by a switch device. However, while illustrated and discussed as being provided by a specific networking device, one of skill in the art in possession of the present disclosure will recognize that the functionality of the networking device 600 discussed below may be provided by other computing devices that are configured to operate similarly as the networking device 600 discussed below.

In the illustrated embodiment, the networking device 600 includes a chassis 602 that houses the components of the networking device 600, only some of which are illustrated and described below. For example, the chassis 602 may house a processing system (not illustrated, but which may include the processor 102 discussed above with reference to FIG. 1) and a memory system (not illustrated, but which may include the memory 114 discussed above with reference to FIG. 1) that is coupled to the processing system and that includes instructions that, when executed by the processing system, cause the processing system to provide a networking engine 604 that is configured to perform the functionality of the networking engines and/or networking devices discussed below.

The chassis 602 may also house a storage system (not illustrated, but which may include the storage 108 discussed above with reference to FIG. 1) that is coupled to the networking engine 604 (e.g., via a coupling between the storage system and the processing system) and that includes a networking database 606 that is configured to store any of the information utilized by the networking engine 604 discussed below. The chassis 602 may also house a communication system 608 that is coupled to the networking engine 604 (e.g., via a coupling between the communication system 608 and the processing system) and that may include the penta-port-cage systems discussed above with reference to FIG. 2 or 3, as well as any other communication components that one of skill in the art in possession of the present disclosure would recognize as enabling the functionality described below. However, while a specific networking device 600 has been illustrated and described, one of skill in the art in possession of the present disclosure will recognize that networking devices (or other devices operating according to the teachings of the present disclosure in a manner similar to that described below for the networking device 600) may include a variety of components and/or component configurations for providing conventional networking device functionality, as well as the penta-port-cage functionality discussed below, while remaining within the scope of the present disclosure as well.

Figure 7A:
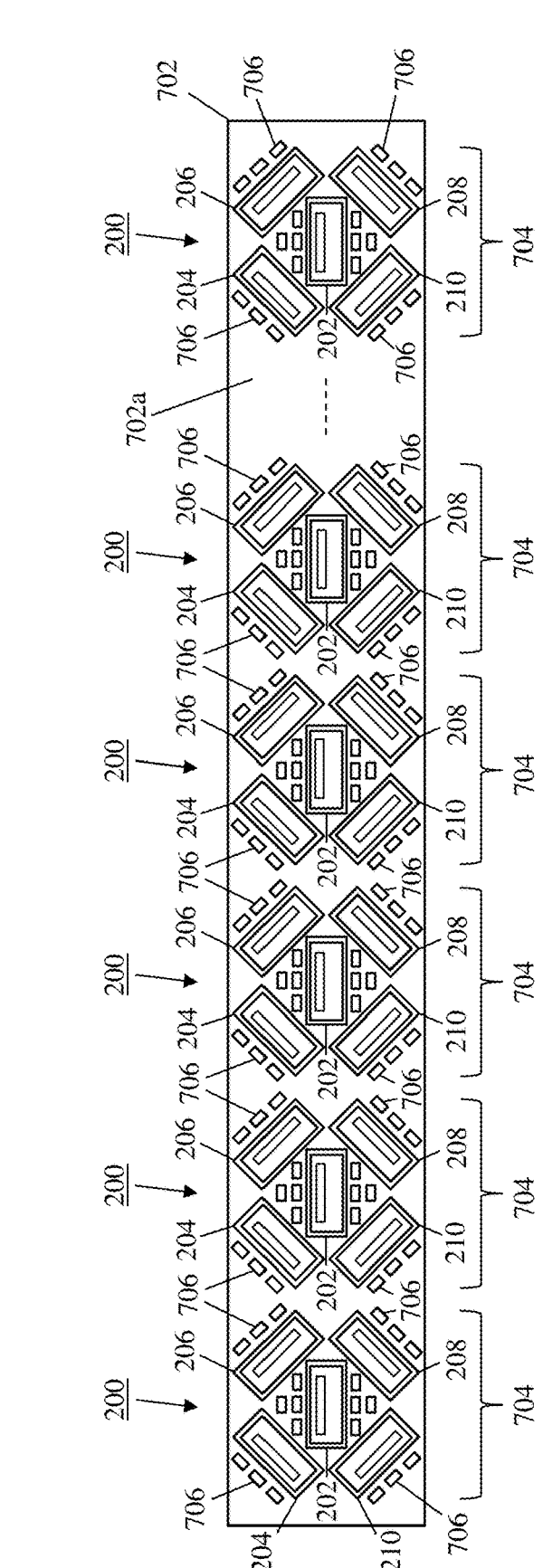
FIG. 7A is a front view illustrating an embodiment of the networking device of FIG. 6 including a plurality of the penta-port-cage systems of FIG. 2.
Figure 7B:
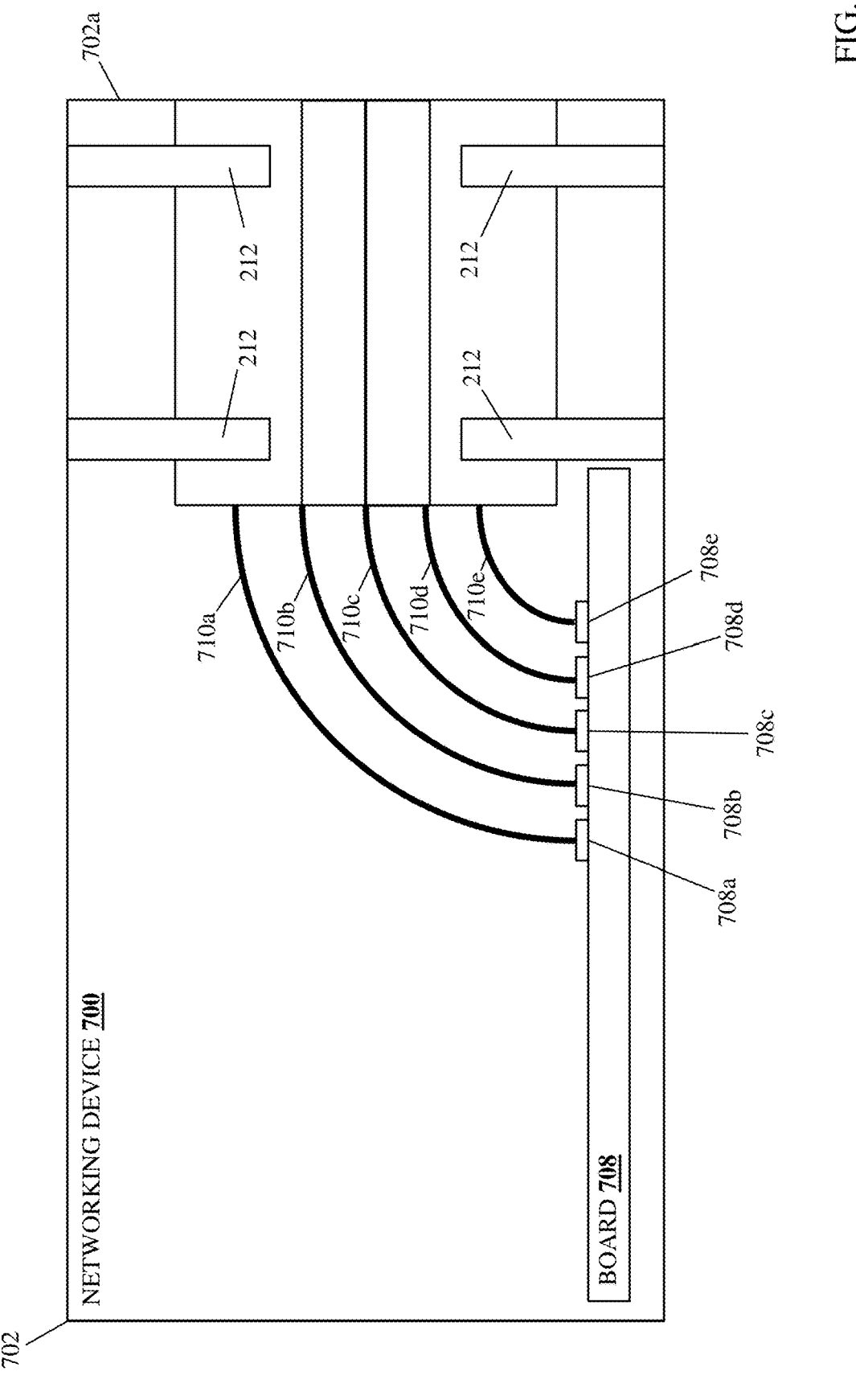
FIG. 7B is a side view illustrating an embodiment of the penta-port-cage system of FIG. 2 provided in the networking device of FIGS. 6 and 7A.
Figure 7C:
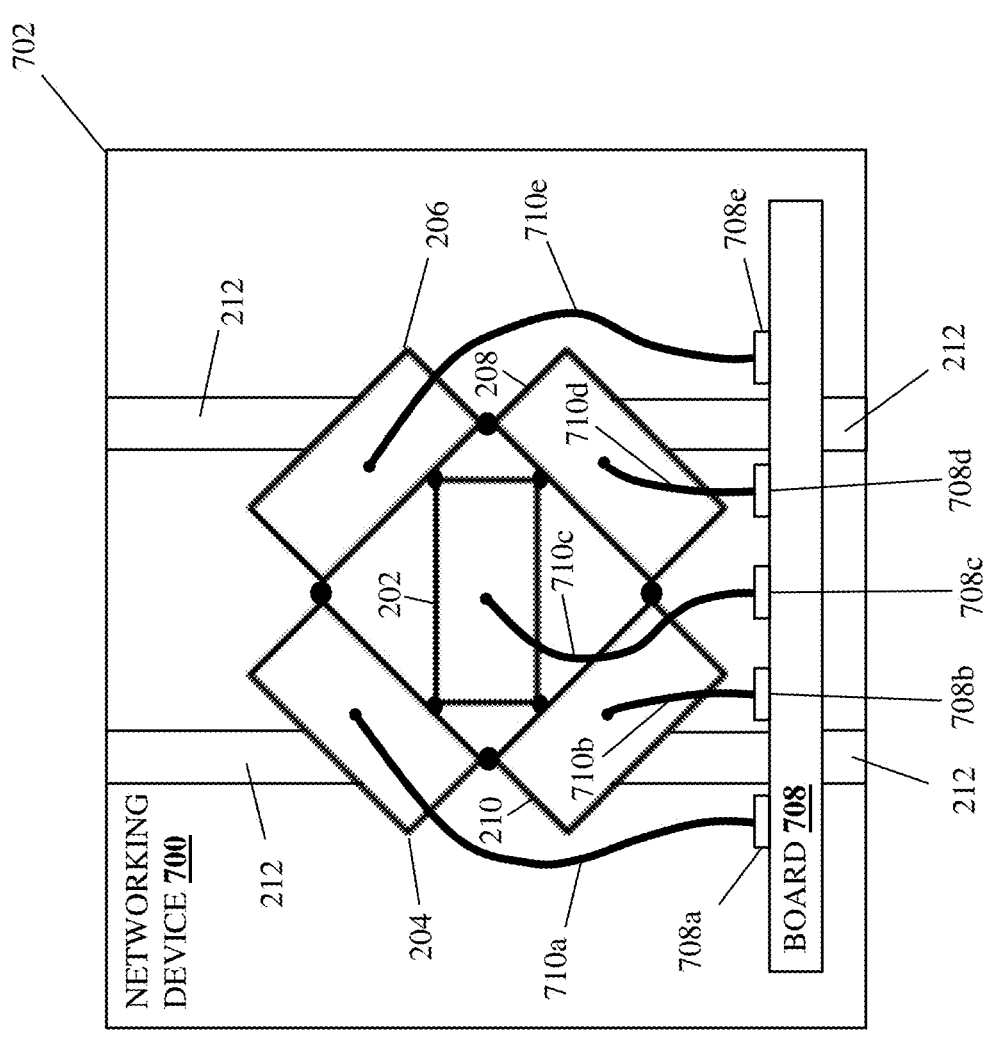
FIG. 7C is a front view illustrating an embodiment of the penta-port-cage system of FIG. 2 provided in the networking device of FIGS. 6 and 7A.

With reference to FIGS. 7A, 7B, and 7C, a networking device 700 is illustrated that may provide the networking device 600 discussed above with reference to FIG. 6. As such, the networking device 600 may be provided by the IHS 100 discussed above with reference to FIG. 1 and/or may include some or all of the components of the IHS 100 and in specific examples may be provided by a switch device. However, while illustrated and discussed as being provided by a specific networking device, one of skill in the art in possession of the present disclosure will recognize that the functionality of the networking device 700 discussed below may be provided by other computing devices that are configured to operate similarly as the networking device discussed below. The networking device 700 includes a chassis 702 that houses the components of the networking device 700 similarly as described for the networking device 600 discussed above with reference to FIG. 6, and the chassis 702 includes a surface 702a.

As can be seen in FIG. 7A, a plurality of port segments 704 may be defined on the surface 702a of the chassis 702, and are used below to illustrated and describe some of the benefits of the penta-port-cage system of the present disclosure. As can be seen, a respective penta-port-cage system 200 may be provided in the chassis 702 in each of the port segments 704 to provide a plurality of ports that may be included in the communication system 608 discussed above with reference to FIG. 6, and that are accessible on the surface 702a of the chassis 702. As illustrated, the chassis 702 may define a plurality of airflow apertures 706 that extend through the surface 702a and that are configured to allow fans in the networking device 700 to generate an airflow via those airflow apertures 706 and through the networking device 700. Furthermore, while a specific configuration of airflow apertures are illustrated in FIG. 7A (e.g., with airflow apertures 706 provided about a perimeter of each penta-port-cage system 200 and adjacent a "top" of each of the "perimeter" port cages 204, 206, 208, and 210, as well as airflow apertures 706 provided between the "central" port cage 202 and the "perimeter" port cages 204/206, and airflow apertures 706 provided between the "central" port cage 202 and the "perimeter" port cages 208/210), one of skill in the art in possession of the present disclosure will appreciate how additional airflow apertures and/or airflow apertures in other configurations may be provided on the surface 702a of the chassis 702 while remaining within the scope of the present disclosure as well.

With reference to FIGS. 7B and 7C, one of the penta-port-cage system 200 in the chassis 702 of the networking device 700 is illustrated, and one of skill in the art in possession of the present disclosure will appreciate how each of the penta-port-cage systems 200 may be provided in the chassis 702 of the networking device 700 similarly as illustrated and described below. As can be seen in FIGS. 7B and 7C, the device chassis mounting members 212 on the penta-port-cage system 200 may be used to mount the penta-port-cage system 200 to the chassis 702 of the networking device 700 (e.g., using screws, adhesives, connectors, and/or other mounting techniques that would be apparent to one of skill in the art in possession of the present disclosure) such that the port entrances 202b, 204d, 206d, 208d, and 210d on the port cages 202, 204, 206, 208, and 210 are accessible on the surface 702a of the chassis 702 in order to provide the ports on the networking device 700 as described herein.

Furthermore, a board 708 (e.g., a motherboard) may be housed in the chassis 702 and may support the components of the networking device 700 such as, for example, the processing system, memory system, storage system, and communication components discussed above with reference to FIG. 6, as well as any other components that would be apparent to one of skill in the art in possession of the present disclosure. In the illustrated example, a plurality of board connectors 708a, 708b, 708c, 708d, and 708e are included on the board 708, and one of skill in the art in possession of the present disclosure will appreciate how the board connectors 708a-708c may be coupled (e.g., via traces in the board 708) to one or more of the components (e.g., the processing system) described above. In the illustrated embodiment, a cable 710a couples the port connector 204e in the port cage 204 to the board connector 708a, a cable 710b couples the port connector 210e in the port cage 210 to the board connector 708b, a cable 710c couples the port connector 202c in the port cage 202 to the board connector 708c, a cable 710d couples the port connector 208e in the port cage 208 to the board connector 708d, and a cable 710e couples the port connector 206e in the port cage 206 to the board connector 708e, and the cables 710a-710e may be provided using flywire techniques, pigtail techniques, and/or other cabling/wiring techniques that would be apparent to one of skill in the art in possession of the present disclosure. However, while a specific example of the provisioning of the penta-port-cage system of the present disclosure in a networking device have been illustrated and described, one of skill in the art in possession of the present disclosure will recognize that penta-port-cage system of the present disclosure may be provided in devices using a variety of components and/or component configurations while remaining within the scope of the present disclosure as well.

Figure 8:
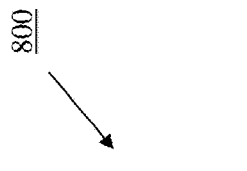
FIG. 8 is a flow chart illustrating an embodiment of a method for connecting ports on a networking device using a penta-port-cage system.
Figure 8:
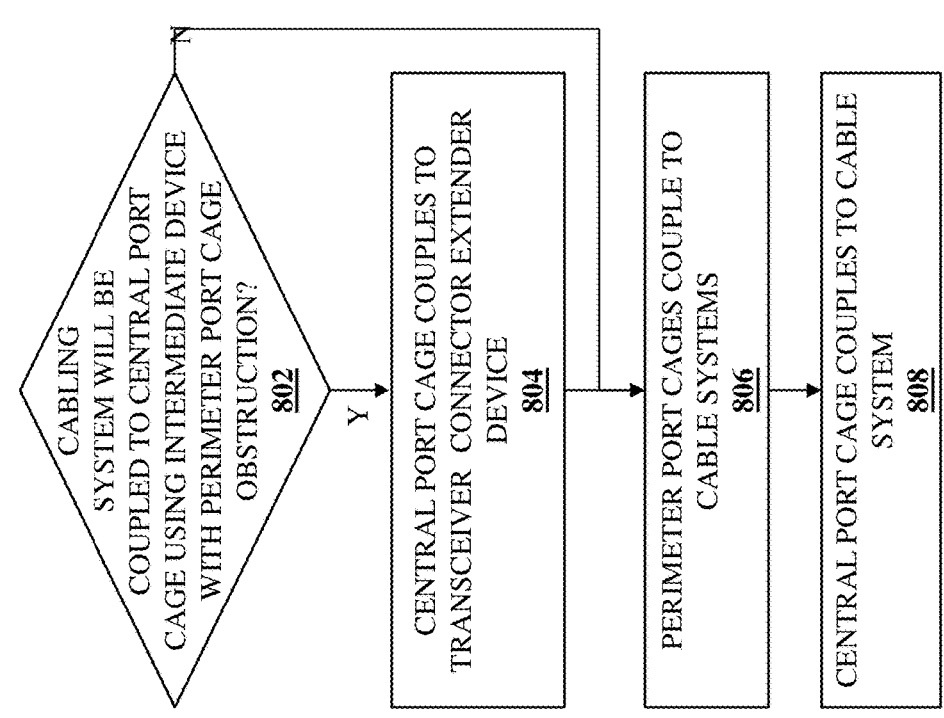

Referring now to FIG. 8, an embodiment of a method 800 for connecting ports on a networking device using a penta-port-cage system is illustrated. As discussed below, the systems and methods of the present disclosure provide a penta-port-cage system that orients five port cages in a manner that increases the number of ports provided in a port segment on a networking device relative to the same size port segment on conventional networking devices. For example, the penta-port-cage system of the present disclosure may include a first port cage. A pair of second port cages on the penta-port-cage system are each connected to the first port cage opposite the first port cage from each other, are each oriented such that they are rotated about their longitudinal axis relative to the first port cage, and are inverted relative to each other. A pair of third port cages on the penta-port-cage system are each connected to the first port cage opposite the first port cage from each other, are each oriented such that they are rotated about their longitudinal axis relative to the first port cage, and are inverted relative to each other. Each of the first port cages, the pair of second port cages, and the pair of third port cages are configured to couple cabling systems to a processing system in a networking device. As such, issues with port density are reduced by increasing the number of ports that are provided on a footprint of a networking device relative to the same footprint of conventional networking devices.

The method 800 begins at decision block 802 where the method 800 may proceed depending on whether a cabling system will be coupled to a central port cage using an intermediate device with a perimeter port cage obstruction. In the embodiments illustrated and described below, transceiver devices are used to couple cabling systems to a networking device via the penta-port-cage systems of the present disclosure, and some transceiver devices may include heat sinks that provide an obstruction for coupling other transceiver devices to the perimeter port cages when that transceiver device is coupled to the central port cage.

Figure 9:
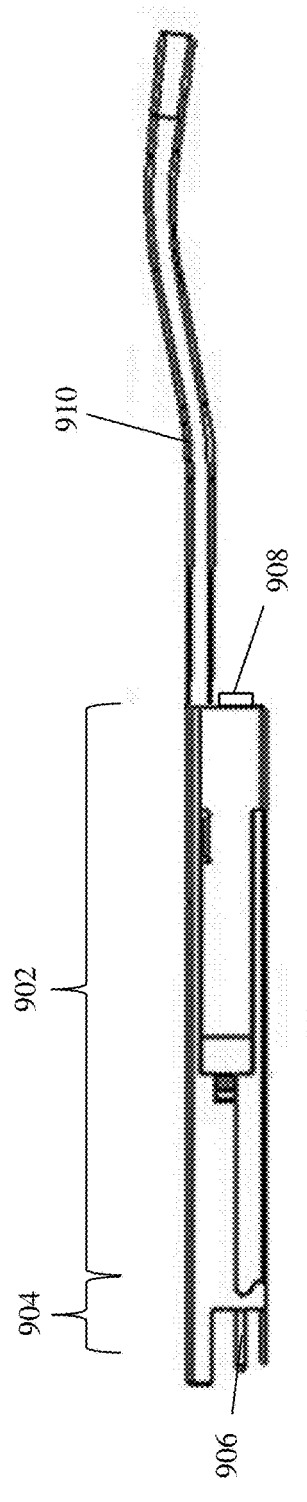
FIG. 9 is a side view illustrating an embodiment of a transceiver device that may be used with the networking device and penta-port-cage systems of FIGS. 7A-7C.

For example, with reference to FIG. 9, an embodiment of a transceiver device 900 that does not include a heat sink is illustrated that is used with the penta-port-cage system of the present disclosure during some of the embodiments of the method 800 described below, and while the transceiver device 900 is illustrated and described as being provided by a conventional Quad Small Form-factor Pluggable Double Density (QSFP-DD) transceiver device, one of skill in the art in possession of the present disclosure will appreciate how other types of transceiver devices will fall within the scope of the present disclosure. In the illustrated embodiment, the transceiver device 900 includes a transceiver chassis 902 that houses the components of the transceiver device 900. A computing device connector guide member 904 (e.g., a QSFP guide member in the illustrated example) extends from the transceiver chassis 902, and a computing device connector 906 (e.g., a male QSFP-DD connector in the illustrated example) extends from the transceiver chassis 902 adjacent the computing device connector guide member 904. A cable connector 908 is located on the transceiver chassis 902 opposite the transceiver chassis 902 from the computing device connector 906 and the computing device connector guide member 904, and a release member 910 extends from the transceiver chassis 902 adjacent the cable connector 908.

Figure 10:
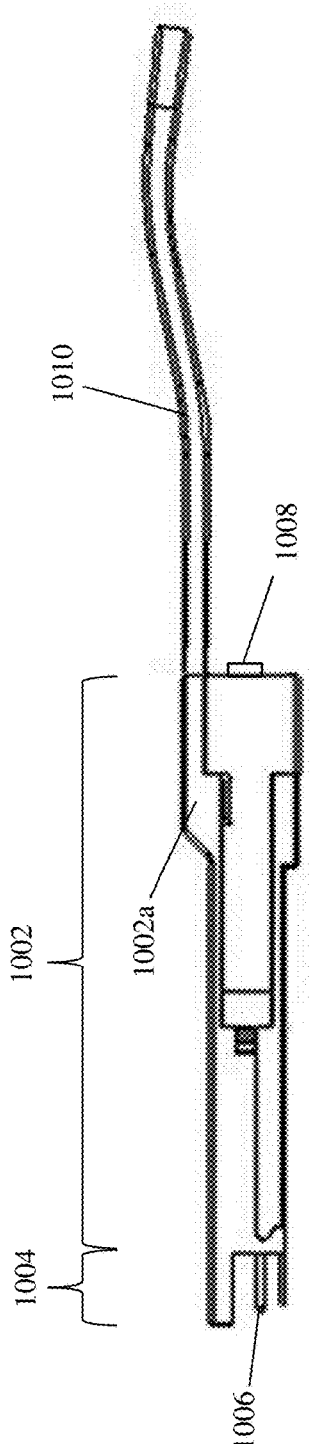
FIG. 10 is a side view illustrating an embodiment of a transceiver device that may be used with the networking device and penta-port-cage systems of FIGS. 7A-7C.

In another example, with reference to FIG. 10, an embodiment of a transceiver device 1000 that includes a heat sink is illustrated that is used with the penta-port-cage system if the present disclosure during some of the embodiments of the method 800 described below, and while the transceiver device 1000 is illustrated and described as being provided by a conventional QSFP-DD transceiver device, one of skill in the art in possession of the present disclosure will appreciate how other types of transceiver devices will fall within the scope of the present disclosure. In the illustrated embodiment, the transceiver device 1000 includes a transceiver chassis 1002 that houses the components of the transceiver device 1000, and a heat sink 1002a is included on that transceiver chassis 1002. A computing device connector guide member 1004 (e.g., a QSFP guide member in the illustrated example) extends from the transceiver chassis 1002, and a computing device connector 1006 (e.g., a male QSFP-DD connector in the illustrated example) extends from the transceiver chassis 1002 adjacent the computing device connector guide member 1004. A cable connector 1008 is located on the transceiver chassis 1002 opposite the transceiver chassis 1002 from the computing device connector 1006 and the computing device connector guide member 1004, and a release member 1010 extends from the transceiver chassis 1002 adjacent the cable connector 1008. However, while a particular intermediate device with a particular feature that provides a perimeter port cage obstruction is illustrated and described, one of skill in the art in possession of the present disclosure will appreciate how other intermediate devices may include other features that provide similar perimeter port cage obstructions while remaining within the scope of the present disclosure.

As such, in an embodiment of decision block 802, the method 800 may proceed depending on whether a transceiver device with a heat sink will be coupled to a central port cage 202 on a penta-port-cage system. However, one of skill in the art in possession of the present disclosure will appreciate how embodiments of the penta-port-cage system of the present disclosure may provide for the connection of cable connectors on cabling systems directly to the port cages, may only utilize intermediate devices that do not include a perimeter port cage obstruction, and/or may otherwise allow decision block 802 to be skipped and the method 800 to begin at block 806 while remaining with the scope of the present disclosure as well.

Figure 11A:
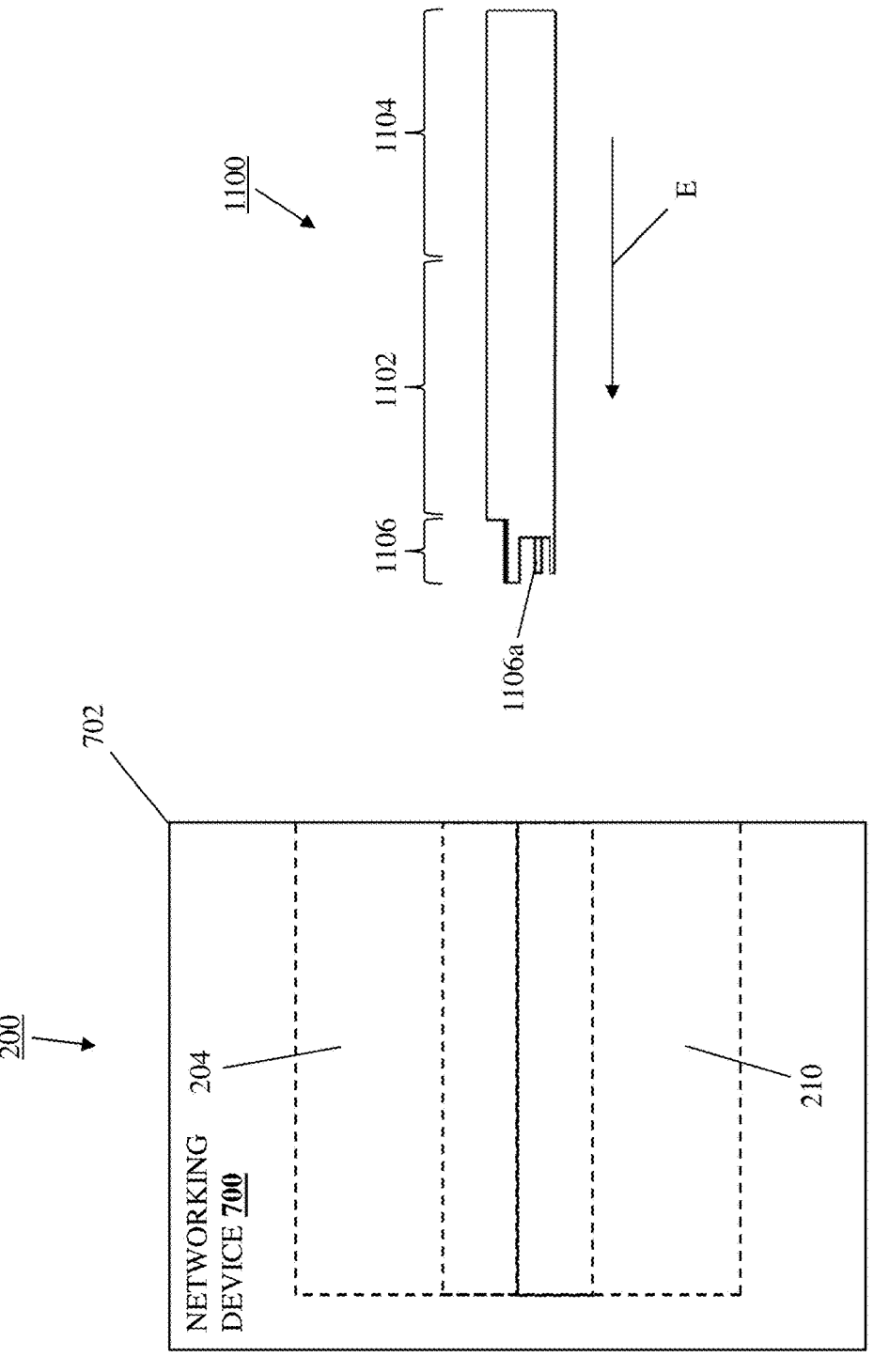
FIG. 11A is a side view illustrating an embodiment of a transceiver connector extender device being connected to a penta-port system on the networking device of FIGS. 7A-7C.

If, at decision block 802, a cabling system will be coupled to the central port cage using an intermediate device with a perimeter port cage obstruction, the method 800 proceeds to block 804 where the central port cage couples to a transceiver connector extension device. With reference to FIG. 11A, in an embodiment of block 804, a transceiver connector extension device 1100 may be provided as described in U.S. patent application Ser. No. 18/655,524, filed on May 6, 2024, the disclosure of which is incorporated by reference herein in its entirety. As described in that patent document, the transceiver connector extension device 1100 includes an extension device chassis 1102 defining an extension device chassis housing along its length that houses components of the transceiver connector extension device 1100, a transceiver cage 1104 extending from the extension device chassis 1102 and defining a transceiver housing along its length while including a transceiver entrance for the transceiver housing opposite the transceiver cage 1104 from the extension device chassis 1102, and a computing device connector guide member 1106 that extends from the extension device chassis 1102 opposite the extension device chassis 1102 from the transceiver cage 1104 and that includes a computing device connector 1106a.

Figure 11B:
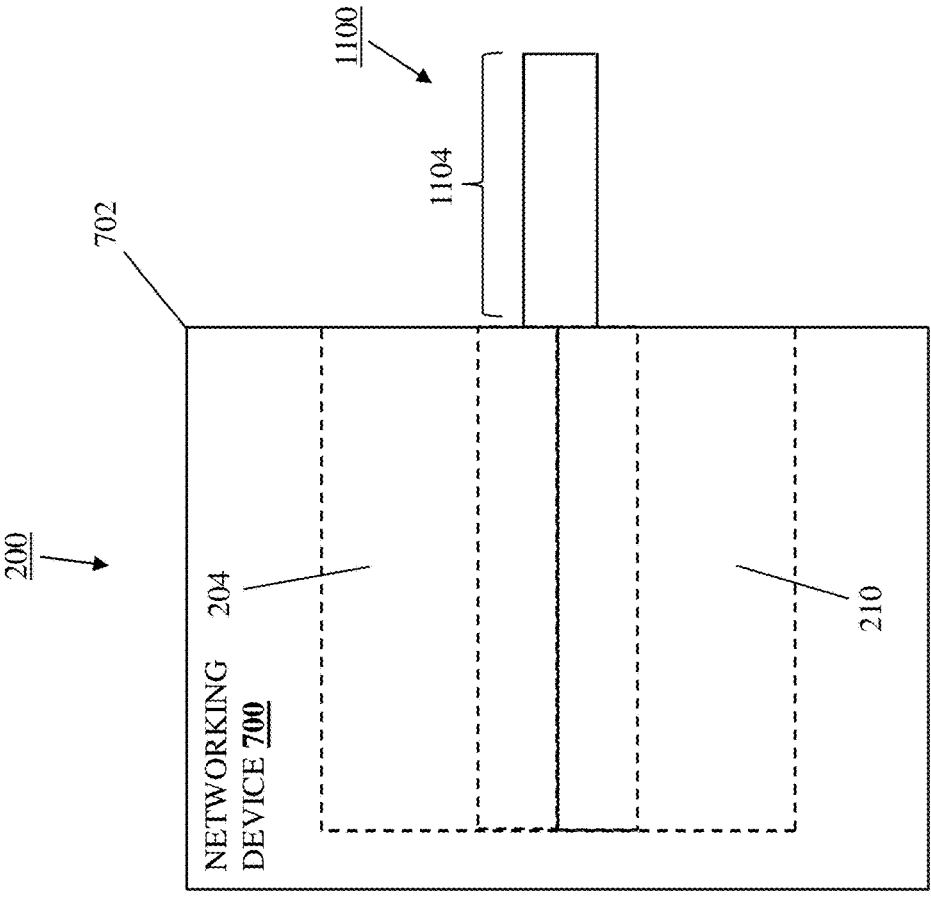
FIG. 11B is a side view illustrating an embodiment of a transceiver connector extender device connected to a central port cage on the penta-port system on the networking device of FIGS. 7A-7C.

While not illustrated in detail, U.S. patent application Ser. No. 18/655,524, filed on May 6, 2024, describes how extension device chassis housing may house a board that couples the computing device connector 1106a to a transceiver device connector that is housed in the transceiver connector extension device 1100 and located approximately at the transition from the extension device chassis 1102 to the transceiver cage 1104, as well as how the computing device connector 1106a may be connected to a transceiver port on a computing device to "extend" the connection point of transceiver devices to that computing device via its transceiver device connector. As such, with reference to FIGS. 11A and 11B, the transceiver connection extension device 1100 may be positioned adjacent the penta-port-cage system 200 on the networking device 700 such that its computing device connector 1106a/computing device connector guide member 1106 are located adjacent and aligned with the port cage housing entrance 202b on the "central" port cage 202. The transceiver connection extension device 1100 may then be moved in a direction E such that the transceiver connection extension device 1100 enters the port cage housing 202a on the "central" port cage 202 via the port cage entrance 202b (e.g., via engagement of the computing device connector guide member 1106 and features on or around the "central" port cage 202), and the computing device connector 1106a engages the port connector 202c.

Figure 11C:
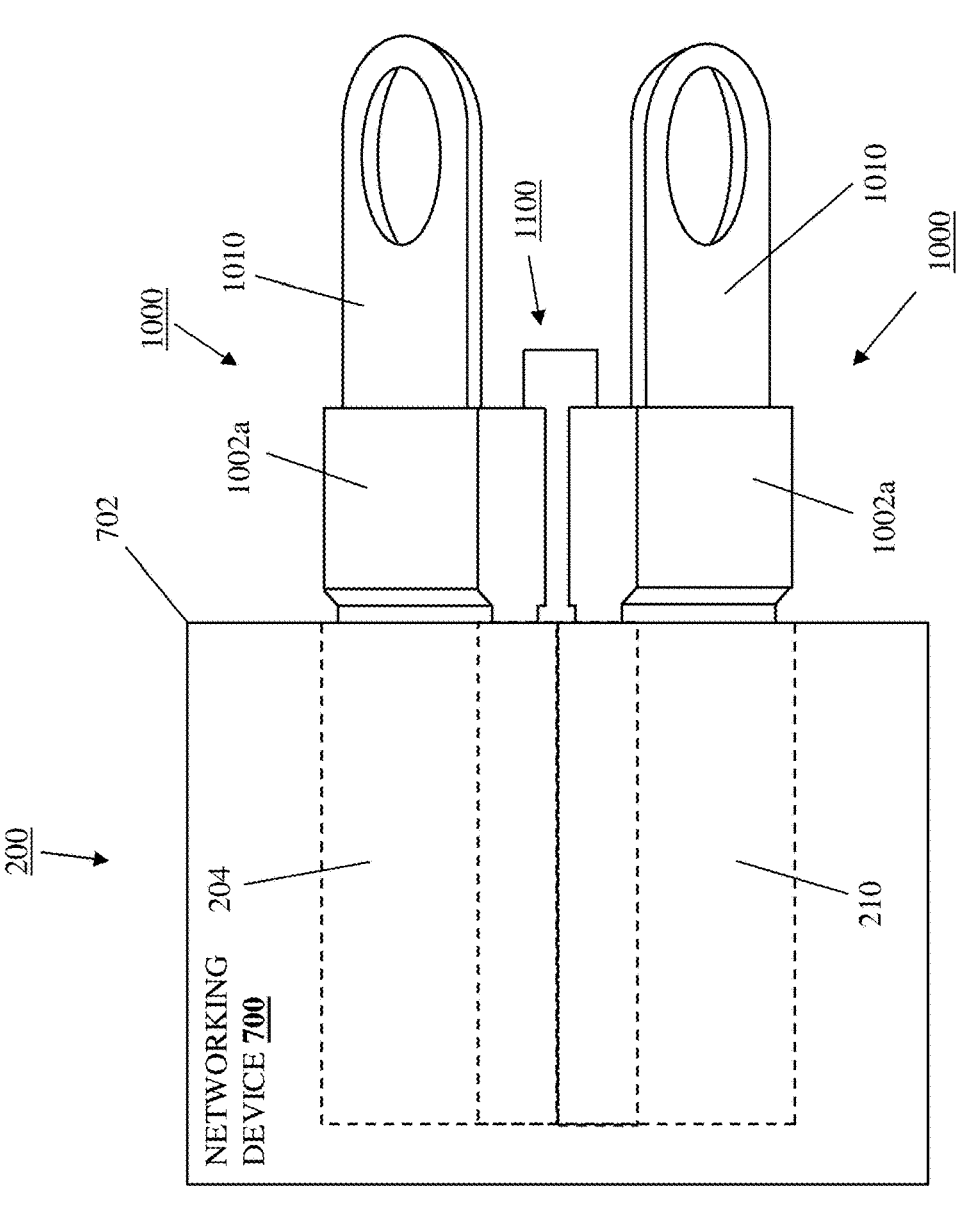
FIG. 11C is a side view illustrating an embodiment of a plurality of the transceiver devices of FIG. 10 connected to perimeter port cages on the penta-port system on the networking device of FIG. 11B.

If, at decision block 806, a cabling system will not be coupled to the central port cage using an intermediate device with a perimeter port cage obstruction, or following block 804, the method 800 proceeds to block 806 where perimeter port cages couple to cabling systems. Continuing with the example described above with reference to FIGS. 11A and 11B, in an embodiment of block 806 and following block 804, respective transceiver devices 1000 may be connected to each of the "perimeter" port cages 204, 206, 208, and 210 by, for example, positioning that transceiver device 1000 adjacent the penta-port-cage system 200 on the networking device 700 such that its computing device connector 1006/ computing device connector guide member 1004 is located adjacent and aligned with the port cage housing entrance (e.g., 204*d*, 206*d*, 208*d*, and 210*d*) on that "perimeter" port cage (e.g., 204, 206, 208, and 210). That transceiver device 1000 may then be moved towards that "perimeter" port cage such that it enters the port cage housing (e.g., 204*c*, 206*c*, 208*c*, and 210*c*) on the "perimeter" port cage (e.g., 204, 206, 208, and 210) via the port cage entrance (e.g., 204*d*, 206*d*, 208*d*, and 210*d*) (e.g., via engagement of the computing device connector guide member 1002 and features on or around that "perimeter" port cage), and its computing device connector 1006 engages the port connector (e.g., 204*c*, 206*e*, 208*c*, and 210*c*), as illustrated in FIG. 11C.

Figure 11D:
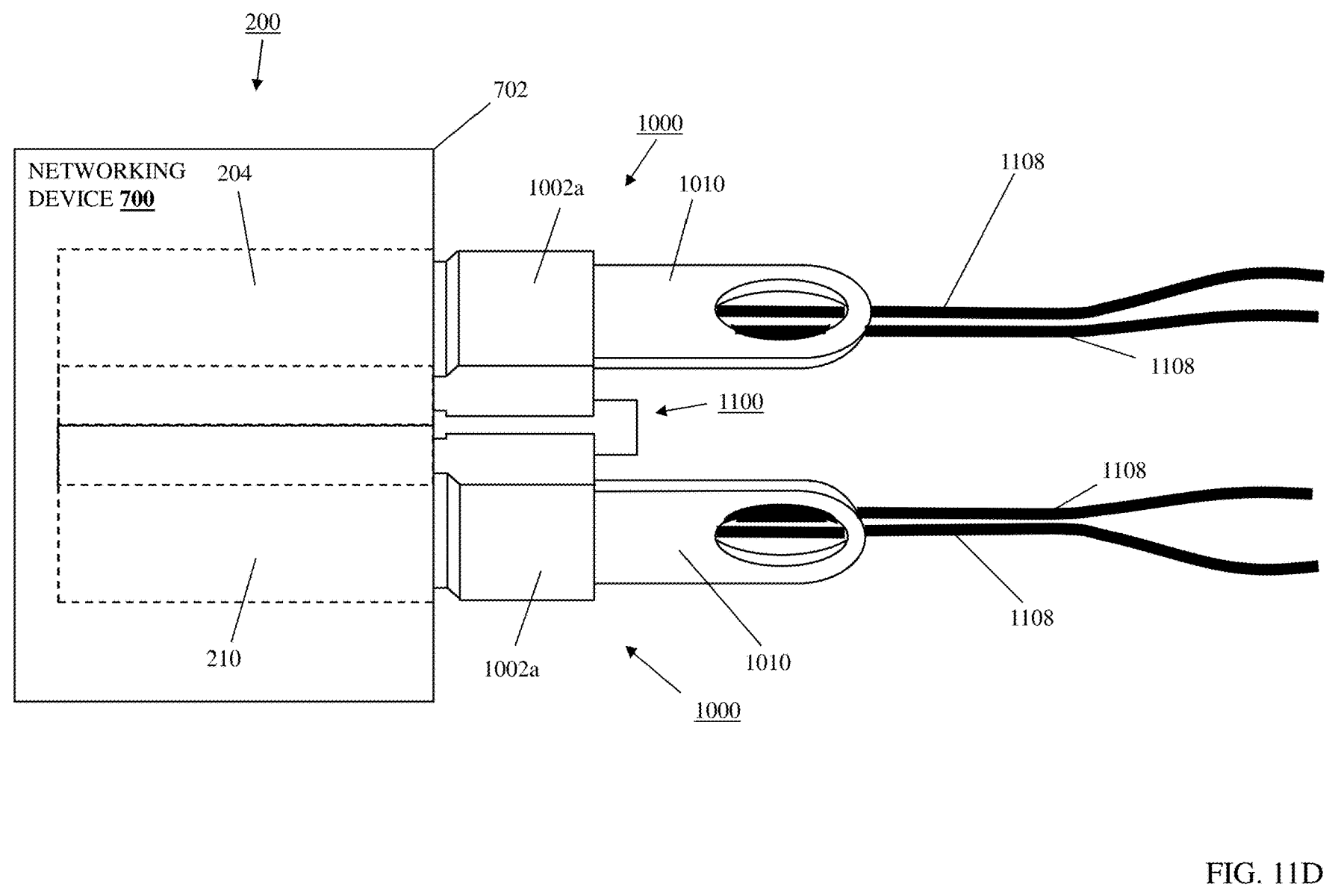

With reference to FIG. 11D, a respective cabling system 1108 may then be connected to each transceiver device 1000 that was connected to one of the "perimeter" port cages 204, 206, 208, and 210 by, for example, positioning a cable connector on that cabling system 1108 adjacent one of the transceiver devices 1000 connected to a respective "perimeter" port cage on the penta-port-cage system 200 such that that cable connector is located adjacent and aligned with the cable connector 1008 on that transceiver device 1000. The cable connector on each cabling system 1108 may then be moved towards its adjacent transceiver device 1000 such that it engages the cable connector 1008 on that transceiver device 1000 to couple its cabling system 1108 to a respective "perimeter" port cage on the penta-port-cage system 200, as illustrated in FIG. 11D.

Figure 12A:
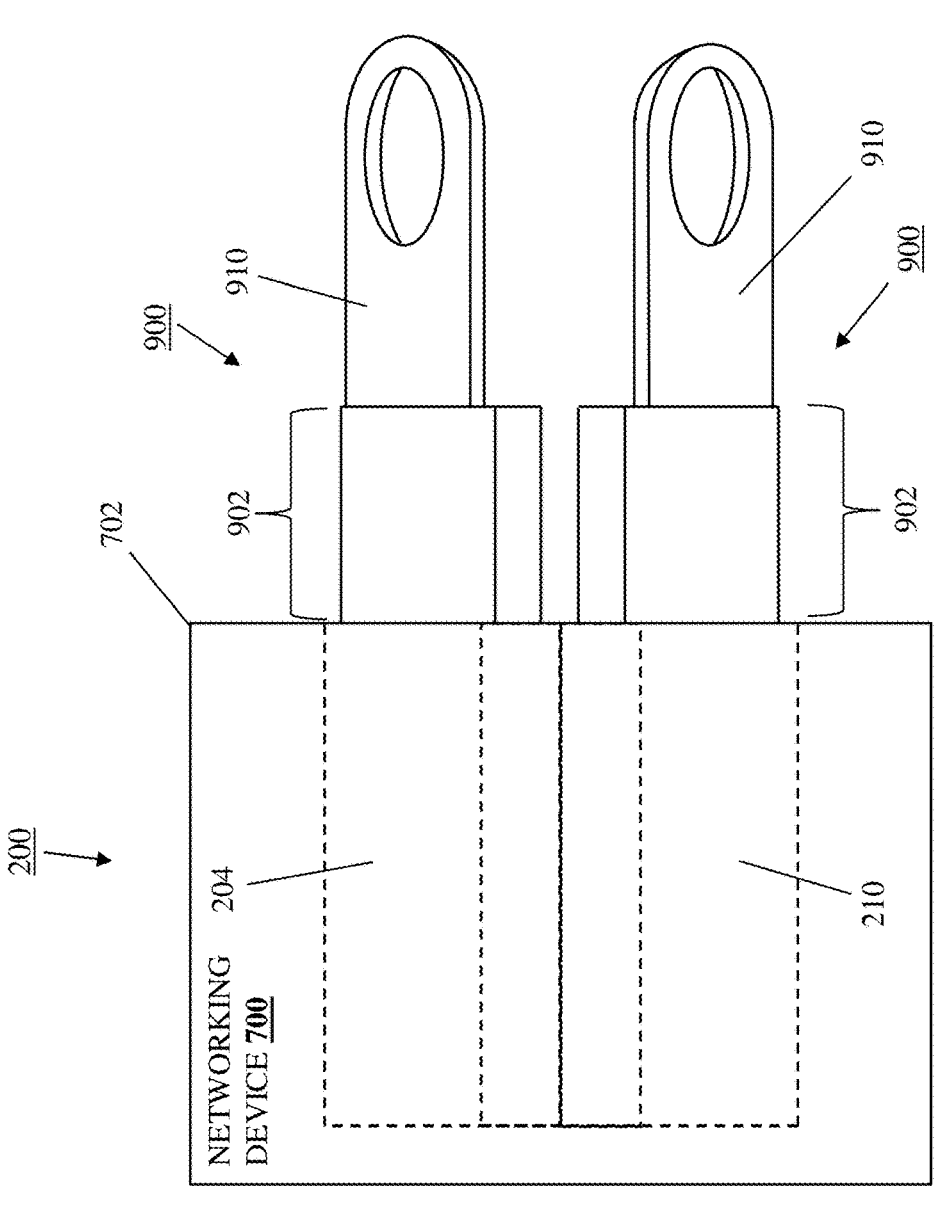
FIG. 12A is a front view illustrating an embodiment of a plurality of the transceiver devices of FIG. 9 connected to perimeter port cages on a penta-port system on the networking device of FIGS. 7A-7C.
Figure 12B:
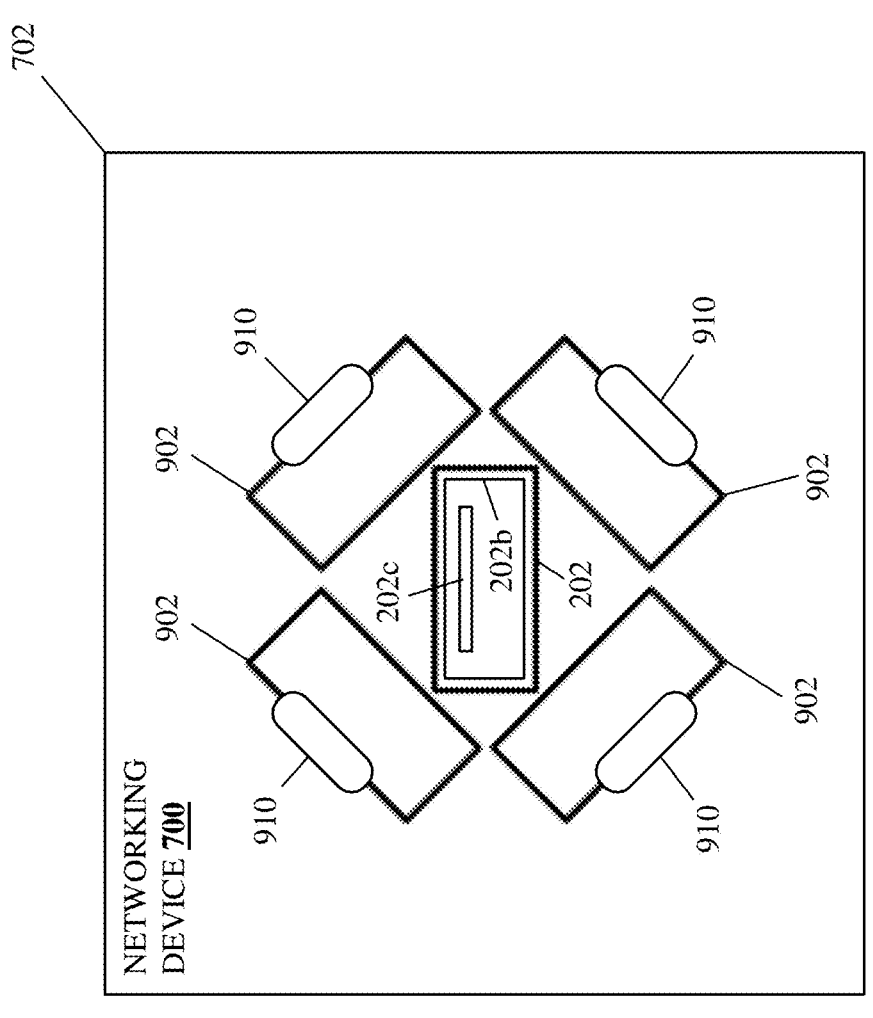
FIG. 12B is a front view illustrating an embodiment of the transceiver devices of FIG. 9 connected to the perimeter port cages on the penta-port system on the networking device of FIG. 12A.

Continuing with the example described above with reference to FIG. 12A, in an embodiment of block 806 and in a situation in which a cabling system will not be coupled to the central port cage using an intermediate device with a perimeter port cage obstruction, respective transceiver devices 900 may be connected to each of the "perimeter" port cages 204, 206, 208, and 210 by, for example, positioning that transceiver device 900 adjacent the penta-port-cage system 200 on the networking device 700 such that its computing device connector 906/computing device connector guide member 904 is located adjacent and aligned with the port cage housing entrance (e.g., 204*d*, 206*d*, 208*d*, and 210*d*) on that "perimeter" port cage (e.g., 204, 206, 208, and 210). That transceiver device 900 may then be moved towards that "perimeter" port cage such that it enters the port cage housing (e.g., 204*c*, 206*c*, 208*c*, and 210*c*) on the "perimeter" port cage (e.g., 204, 206, 208, and 210) via the port cage entrance (e.g., 204*d*, 206*d*, 208*d*, and 210*d*) (e.g., via engagement of the computing device connector guide member 902 and features on or around that "perimeter" port cage), and its computing device connector 906 engages the port connector (e.g., 204*c*, 206*c*, 208*c*, and 210*c*), as illustrated in FIGS. 12A and 12B.

Figure 12C:
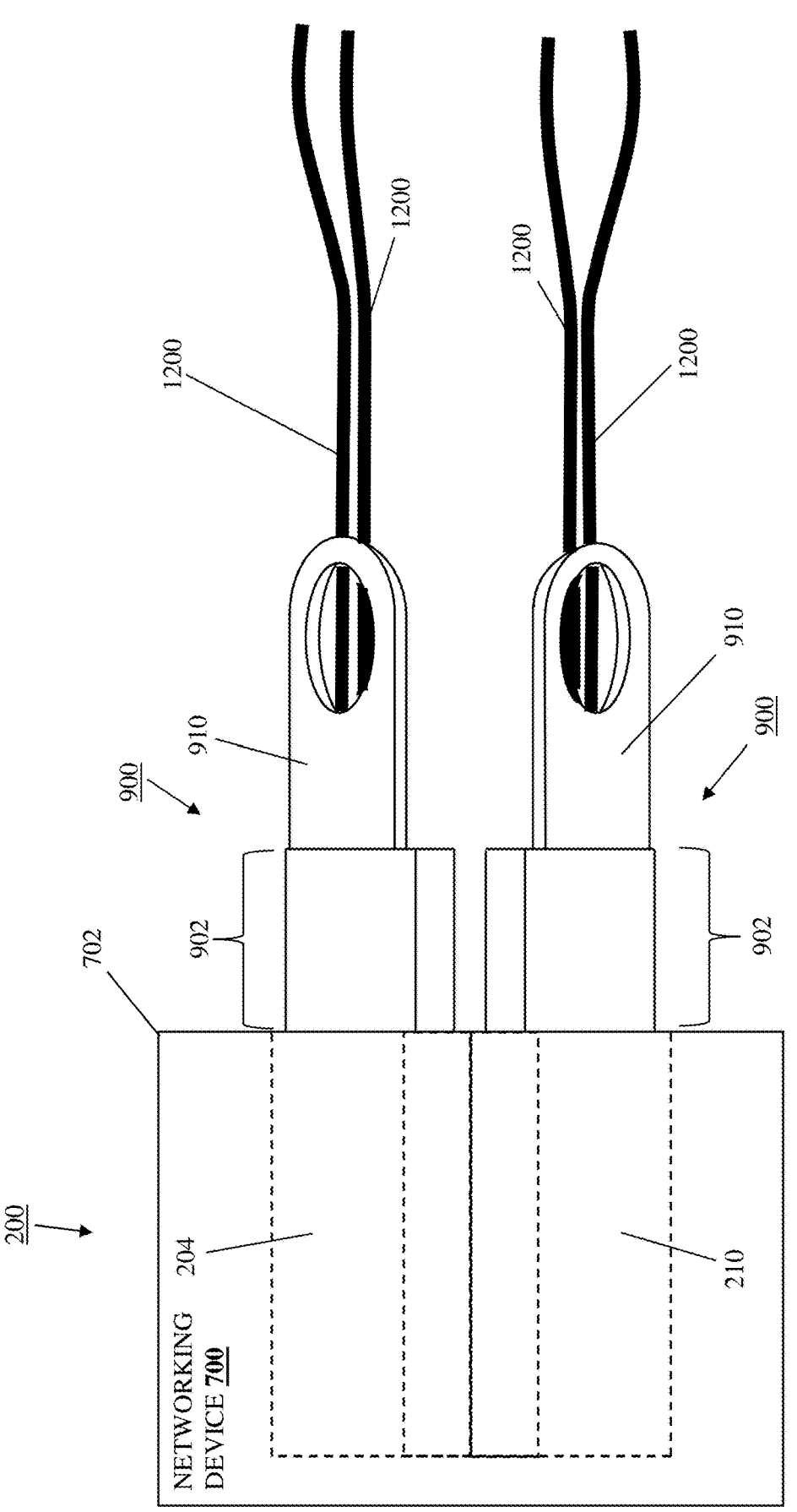
FIG. 12C is a side view illustrating an embodiment of cabling systems connected to the plurality of the transceiver devices connected to the perimeter port cages on the penta-port system on the networking device of FIG. 12B.

With reference to FIG. 12C, a respective cabling system 1200 may then be connected to each transceiver device 900 that was connected to one of the "perimeter" port cages 204, 206, 208, and 210 by, for example, positioning a cable connector on that cabling system 1200 adjacent one of the transceiver devices 900 connected to a respective "perimeter" port cage on the penta-port-cage system 200 such that that cable connector is located adjacent and aligned with the cable connector 908 on that transceiver device 900. The cable connector on each cabling system 1200 may then be moved towards its adjacent transceiver device 900 such that it engages the cable connector 908 on that transceiver device 900 to couple its cabling system 1200 to a respective "perimeter" port cage on the penta-port-cage system 200, as illustrated in FIG. 12C.

Figure 11E:
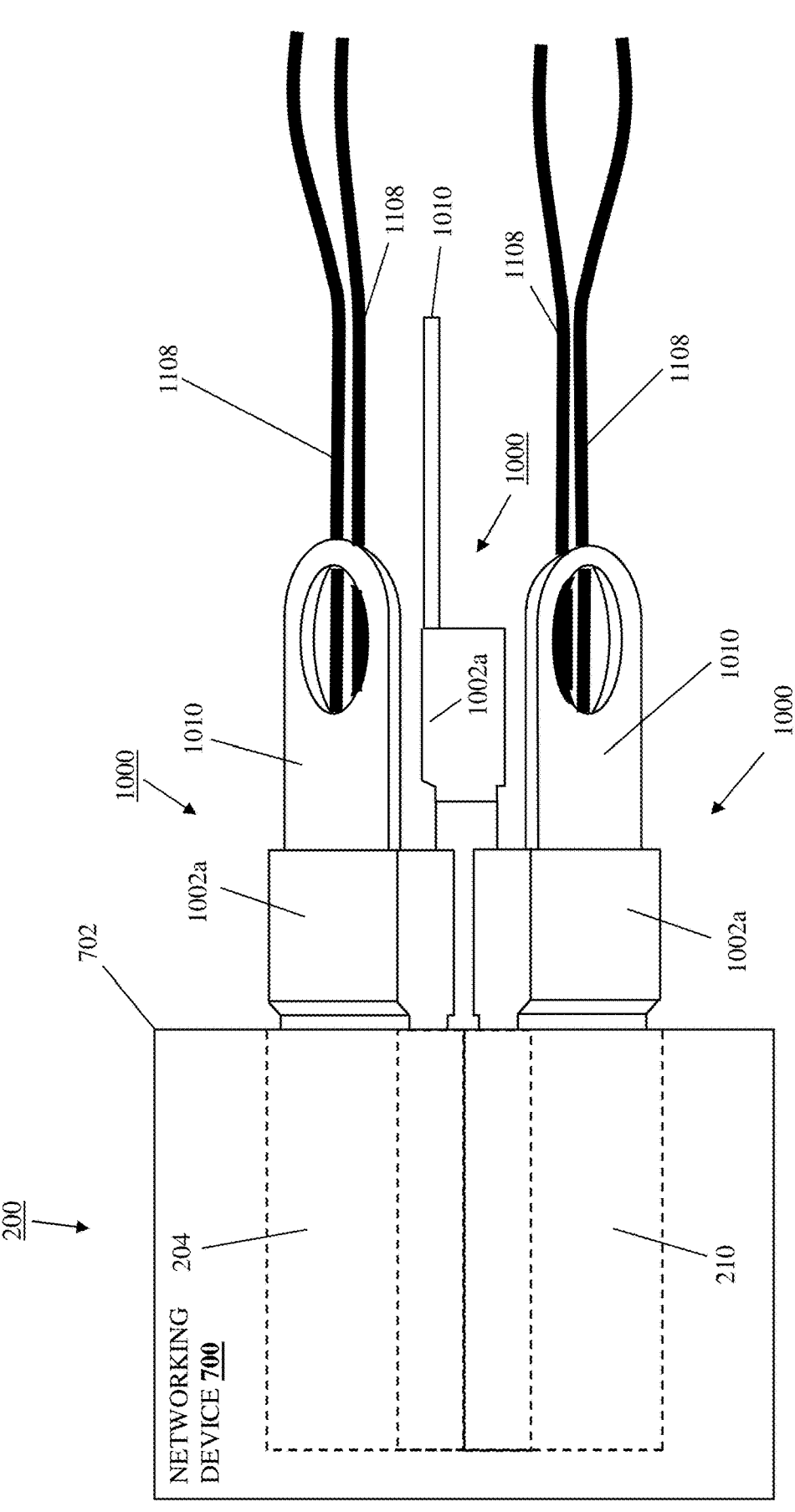
FIG. 11E is a side view illustrating an embodiment of a transceiver device of FIG. 10 connected to the transceiver connector extension device connected to the central port cage on the penta-port system on the networking device of FIG. 11D.
Figure 11F:
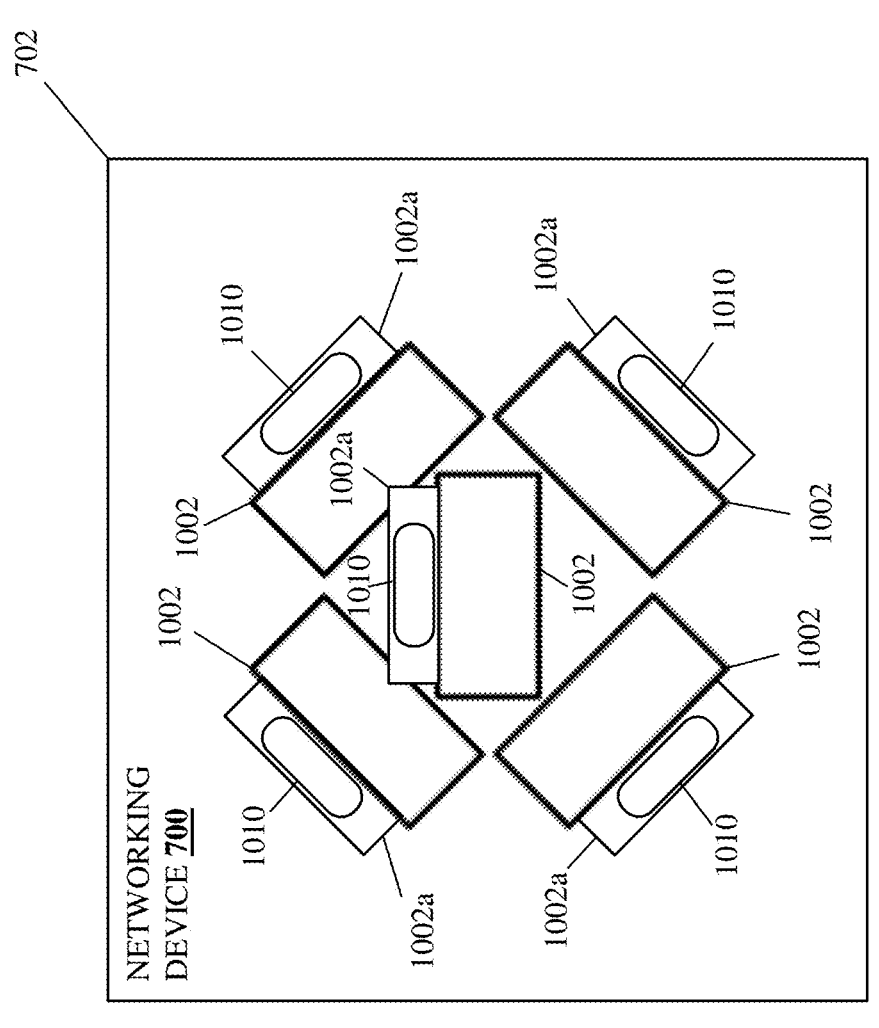
FIG. 11F is a front view illustrating an embodiment of transceiver devices of FIG. 10 connected to the penta-port system on the networking device of FIG. 11D.

The method 800 then proceeds to block 808 where the central port cage couples to a cabling system. Continuing with the example described above with reference to FIGS. 11A-11C, in an embodiment of block 808, a transceiver device 1000 may be connected to the transceiver connector extension device 1100 that was connected to the "central" port cage 202 by, for example, positioning that transceiver device 1000 adjacent that transceiver connector extension device 1100 such that its computing device connector 1006/ computing device connector guide member 1004 is located adjacent and aligned with a transceiver cage housing entrance of the transceiver cage housing defined by the transceiver cage 1004 on transceiver connector extension device 1100. The transceiver device 1000 may then be moved towards the transceiver connector extension device 1100 such that it enters the transceiver cage housing defined by the transceiver cage 1104 via the transceiver cage housing entrance (e.g., via engagement of the computing device connector guide member 1002 and features on or around the transceiver cage 1104), and its computing device connector 1006 engages the transceiver device connector accessible via the transceiver cage housing defined by the transceiver cage 1104, as illustrated in FIG. 11E. As can be seen in FIGS. 11E and 11F (with the cabling systems removed in FIG. 11F for clarity), the transceiver connection extension device 1100 connected to the "central" port cage 202 positions the transceiver device 1000 coupled thereto such that its heat sink 1002*a* does not provide a perimeter port cage obstruction that would interfere with the connection of the transceiver devices 1000 to the "perimeter" port cages 204, 206, 208, and 210.

Figure 11G:
FIG. 11G is a side view illustrating an embodiment of a cabling system connected to the transceiver device connected to the transceiver connector extension device connected to the central port cage on the penta-port system on the networking device of FIG. 11E.

With reference to FIG. 11G, a cabling system 1108 may be connected to the transceiver device 1000 that was connected to the transceiver connector extension device 1100 connected to the "central" port cage 202 by, for example, positioning a cable connector 1108*a* on that cabling system 1108 adjacent the transceiver device 1000 such that that cable connector 1008*a* is located adjacent and aligned with the cable connector 1008 on the transceiver device 1000. The cable connector 1108*a* on the cabling system 1108 may then be moved towards the transceiver device 1000 such that it engages the cable connector 1008 on the transceiver device 1000 to couple the cabling system 1108 to the "central" port cage 202 on the penta-port-cage system 200 via the transceiver connector extension device 1100, as illustrated in FIG. 11G. As will be appreciated by one of skill in the art in possession of the present disclosure, following block 808, the networking engine 604 discussed above with reference to FIG. 6 may transmit data using any of the cabling systems 1108.

Figure 12D:
FIG. 12D is a front view illustrating an embodiment of the transceiver device of FIG. 9 connected to a central port cage on the penta-port system on the networking device of FIG. 12C.
Figure 12E:
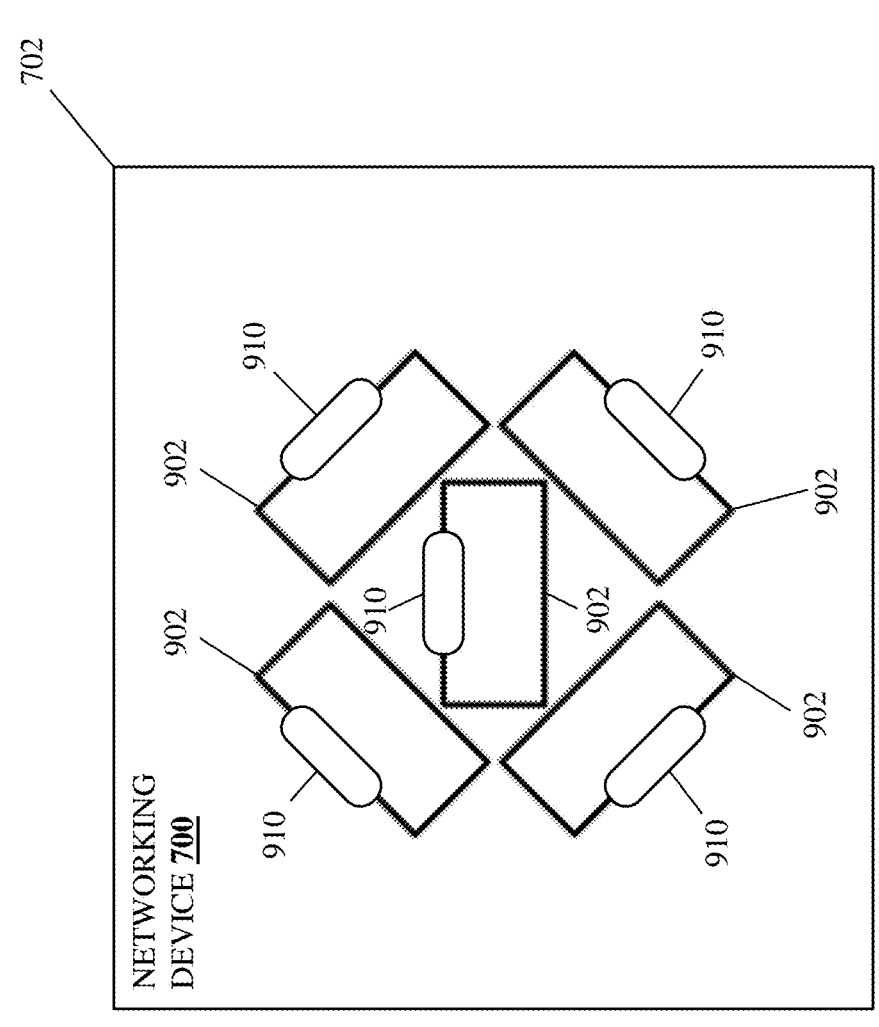
FIG. 12E is a front view illustrating an embodiment of the transceiver devices of FIG. 9 connected to the penta-port system on the networking device of FIG. 12D.

Continuing with the example described above with reference to FIGS. 12A-12C, in an embodiment of block 808, a transceiver device 900 may be connected to the "central" port cage 202 by, for example, positioning that transceiver device 900 adjacent the "central" port cage 202 on the penta-port-cage system 200 such that its computing device connector 906/computing device connector guide member 904 is located adjacent and aligned with the port cage housing entrance 202b of the port cage housing 202a on the "central" port cage 202. The transceiver device 900 may then be moved towards the "central" port cage 202 such that it enters the port cage housing 202a via the port cage housing entrance 202b (e.g., via engagement of the computing device connector guide member 902 and features on or around the "central" port cage 202), and its computing device connector 906 engages the port connector 202c on the "central" port cage 202, as illustrated in FIGS. 12D and 12E.

Figure 12F:
FIG. 12F is a side view illustrating an embodiment of a cabling system connected to the central port cage on the penta-port system on the networking device of FIG. 12E.

With reference to FIG. 12F, a cabling system 1200 may be connected to the transceiver device 900 that was connected to the "central" port cage 202 by, for example, positioning a cable connector 1200a on that cabling system 1200 adjacent the transceiver device 900 such that that cable connector 1200a is located adjacent and aligned with the cable connector 908 on the transceiver device 900. The cable connector 1200a on the cabling system 1200 may then be moved towards the transceiver device 900 such that it engages the cable connector 908 on the transceiver device 900 to couple the cabling system 1200 to the "central" port cage 202 on the penta-port-cage system 200, as illustrated in FIG. 12F. As will be appreciated by one of skill in the art in possession of the present disclosure, following block 808, the networking engine 604 discussed above with reference to FIG. 6 may transmit data using any of the cabling systems 1200.

Figure 13A:
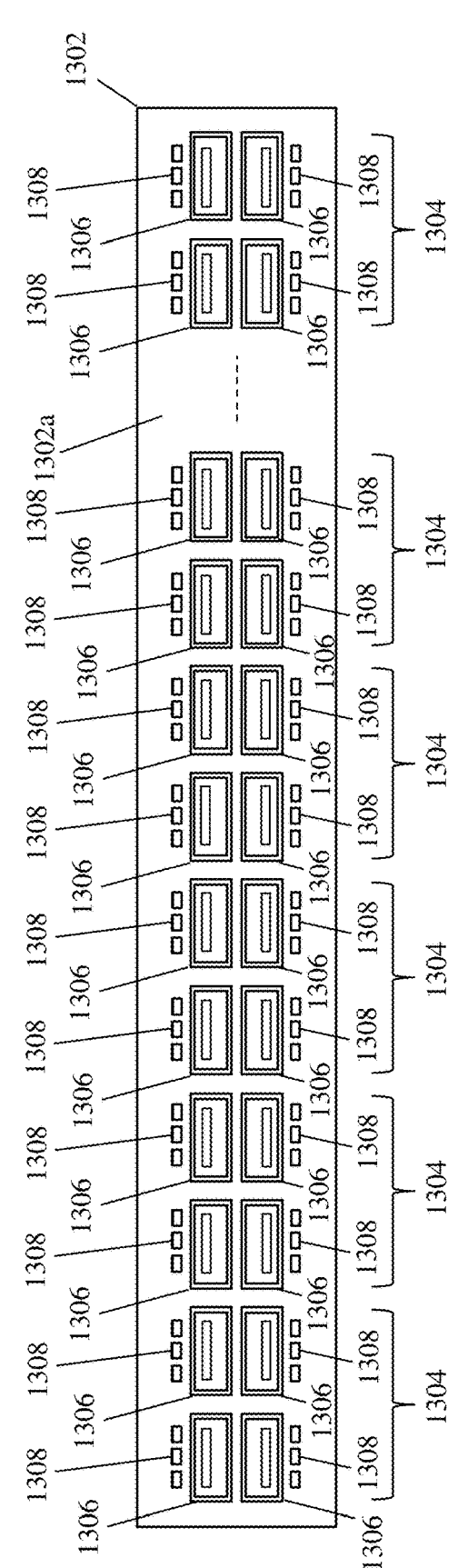
FIG. 13A is a front view illustrating an embodiment of a conventional networking device.

With reference to FIG. 13A, a conventional networking device 1300 is illustrated and described for purposes of comparison to networking devices provided with the penta-port-cage system of the present disclosure. The conventional networking device 1300 includes a chassis 1302 that houses the components of the conventional networking device 1300, and that includes a surface 1302a. Similarly as the networking device 700 discussed above with reference to FIG. 7A, a plurality of port segments 1304 may be defined on the surface 1302a of the chassis 1308, and may include dimensions that are the same or similar to the port segments 704 defined on the surface 702a of the chassis 702 of the networking device 700. As can be seen, a four port cages 1306 may be provided in each of the port segments 704 on the conventional networking device 1300 to provide a plurality of ports that are accessible on the surface 1302a of the chassis 1302. Furthermore, the chassis 1302 may define a plurality of airflow apertures 1308 that extend through the surface 1302a and that are configured to allow fans in the networking device 1300 to generate an airflow through those airflow apertures 1306 and through the networking device 1300.

Figure 13B:
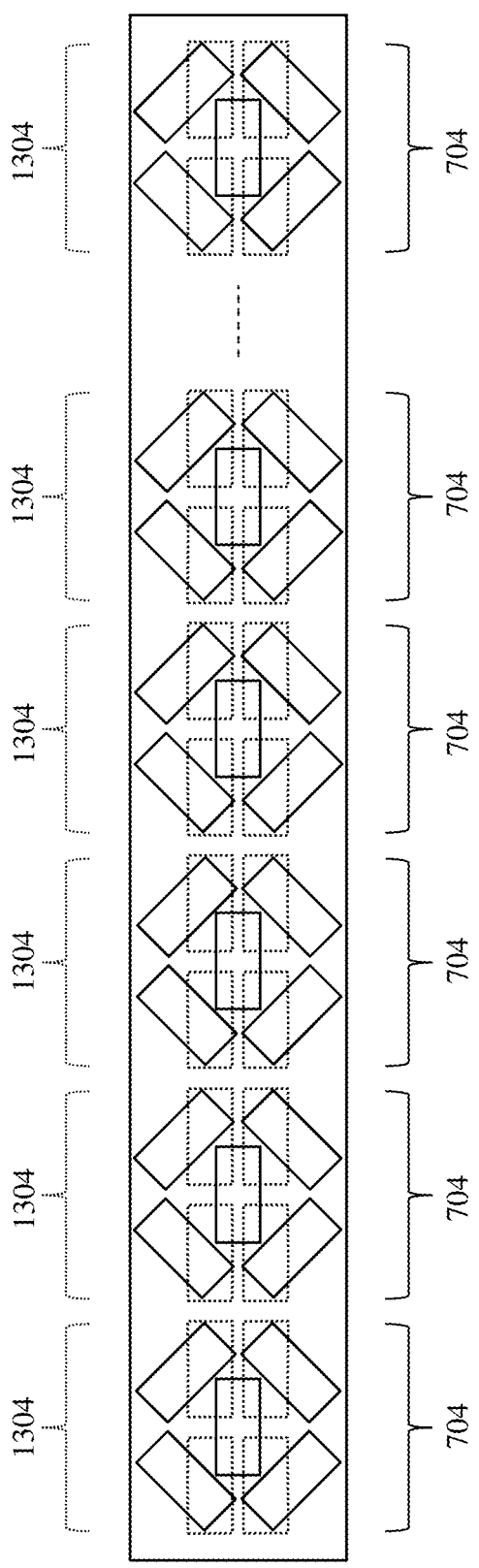
FIG. 13B is a front view illustrating an embodiment of a comparison of the conventional networking device of FIG. 13A with the networking device of FIG. 7A.

With reference to FIG. 13B, a comparison of ports provided on the networking device 700 (illustrated in solid lines) with ports provided on the conventional networking device 1300 (illustrated in dotted lines) is provided to illustrated how the teachings of the present disclosure enable the provisioning of additional ports in the same footprint of a networking device. As can be seen in FIG. 13B, each port segment 1304 on the conventional networking device 1300 allows for the provisioning of four ports, while each port segment 704 on the networking device 700 having the same dimensions as the port segments 1304 allows for the provisioning of five ports (i.e., via the five port cages provided by each penta-port-cage system).

Thus, systems and methods have been described that provide for a penta-port-cage system that orients five port cages in a manner that increases the number of ports provided in a port segment on a networking device relative to the same size port segment on conventional networking devices. For example, the penta-port-cage system of the present disclosure may include a first port cage. A pair of second port cages on the penta-port-cage system are each connected to the first port cage opposite the first port cage from each other, are each oriented such that they are rotated about their longitudinal axis relative to the first port cage, and are inverted relative to each other. A pair of third port cages on the penta-port-cage system are each connected to the first port cage opposite the first port cage from each other, are each oriented such that they are rotated about their longitudinal axis relative to the first port cage, and are inverted relative to each other. Each of the first port cages, the pair of second port cages, and the pair of third port cages are configured to couple cabling systems to a processing system in a networking device. As such, issues with port density are reduced by increasing the number of ports that are provided on a footprint of a networking device relative to the same footprint of conventional networking devices.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A penta-port-cage system, comprising:
a first port cage;
a pair of second port cages that are each connected to and fixed relative to the first port cage such that they are on opposite sides of the first port cage from each other, that are each angled relative to the first port cage by a respective angle between their respective longitudinal axis and a longitudinal axis of the first port cage, and that are inverted relative to each other; and
a pair of third port cages that are each connected to and fixed relative to the first port cage such that they are on opposite sides of the first port cage from each other, that are each angled relative to the first port cage by a respective angle between their respective longitudinal axis and a longitudinal axis of the first port cage, and that are inverted relative to each other.

2. The system of claim 1, further comprising:
a plurality of device chassis mounting members that extend from at least one of the second port cages and the third port cages and that are configured to mount to a device chassis.

3. The system of claim 1, further comprising:
a respective port connector included in the first port cage, each of the pair of second port cages, and each of the pair of third port cages; and
a respective board cable extending from the respective port connector included in the first port cage, each of the pair of second port cages, and each of the pair of third port cages, where each respective board cable is configured to connect to a board to couple the respective port connector in the first port cage, each of the pair of second port cages, and each of the pair of third port cages to the board.

4. The system of claim 1, wherein a first of each of the pair of second port cages and the pair of third port cages is angled relative to the first port cage by the same angle between their respective longitudinal axis and the longitudinal axis of the first port cage but in opposite directions, and wherein a second of each of the pair of second port cages and the pair of third port cages is angled relative to the first port cage by the same angle between their respective longitudinal axis and the longitudinal axis of the first port cage but in opposite directions.

5. The system of claim 1, wherein each of the second port cages and the third port cages includes opposing side surfaces, and wherein a respective structural support element extends between adjacent side surfaces on adjacent first and second port cages.

6. The system of claim 1, wherein the first port cage, each of the pair of second port cages, and each of the pair of third port cages are configured to receive a respective Quad Small Form-factor Pluggable (QSFP) transceiver device.

7. An Information Handling System (IHS), comprising:
   a device chassis;
   a processing system that is housed in the device chassis; and
   a communication system that is housed in the device chassis, that is coupled to the processing system, and that includes a plurality of penta-port-cage systems, wherein each penta-port-cage system includes:
      a first port cage that is accessible on a surface of the device chassis;
      a pair of second port cages that are each accessible on the surface of the device chassis, that are each connected to and fixed relative to the first port cage such that they are on opposite sides of the first port cage from each other, that are each angled relative to the first port cage by a respective angle between their respective longitudinal axis and a longitudinal axis of the first port cage, and that are inverted relative to each other; and
      a pair of third port cages that are each accessible on the surface of the device chassis, that are each connected to and fixed relative to the first port cage such that they are on opposite sides of the first port cage from each other, that are each angled relative to the first port cage by a respective angle between their respective longitudinal axis and a longitudinal axis of the first port cage, and that are inverted relative to each other.

8. The IHS of claim 7, wherein each penta-port-cage system includes:
   a plurality of device chassis mounting members that extend from at least one of second port cages and the third port cages on that penta-port-cage system and that are mounted to the device chassis.

9. The IHS of claim 7, wherein each penta-port-cage system includes:
   a respective port connector included in the first port cage, each of the pair of second port cages, and each of the pair of third port cages on that penta-port-cage system; and
   a respective board cable extending from the respective port connector included in the first port cage, each of the pair of second port cages, and each of the pair of third port cages on that penta-port-cage system, where each respective board cable is configured to connect to a board to couple the respective port connector in the first port cage, each of the pair of second port cages, and each of the pair of third port cages on that penta-port-cage system to the board.

10. The IHS of claim 7, wherein a first of each of the pair of second port cages and the pair of third port cages on each penta-port-cage system is angled relative to the first port cage on that penta-port-cage system by the same angle between their respective longitudinal axis and the longitudinal axis of the first port cage but in opposite directions, and wherein a second of each of the pair of second port cages and the pair of third port cages on each penta-port-cage system is angled relative to the first port cage on that penta-port-cage system by the same angle between their respective longitudinal axis and the longitudinal axis of the first port cage but in opposite directions.

11. The IHS of claim 7, wherein each of the second port cages and the third port cages on each penta-port-cage system includes opposing side surfaces, and wherein a respective structural support element extends between adjacent side surfaces on adjacent first and second port cages on each penta-port-cage system.

12. The IHS of claim 7, wherein the first port cage, each of the pair of second port cages, and each of the pair of third port cages on each penta-port-cage system are configured to receive a respective Quad Small Form-factor Pluggable (QSFP) transceiver device.

13. The IHS of claim 7, wherein the device chassis defines a plurality of airflow apertures adjacent the first port cage, each of the pair of second port cages, and each of the pair of third port cages on each penta-port-cage system.

14. A method for connecting ports on a networking device using a penta-port-cage system, comprising:
   coupling, by a first port cage on a penta-port-cage system, to a first cabling system;
   coupling, by each of a pair of second port cages on the penta-port-cage system, to respective second cabling systems, wherein the pair of second port cages are connected to and fixed relative to the first port cage such that they are on opposite sides of the first port cage from each other, are each angled relative to the first port cage by a respective angle between their respective longitudinal axis and a longitudinal axis of the first port cage, and are inverted relative to each other; and
   coupling, by each of a pair of third port cages on the penta-port-cage system, to respective third cabling systems, wherein the pair of third port cages are connected to and fixed relative to the first port cage such that they are on opposite sides of the first port cage from each other, are each angled relative to the first port cage by a respective angle between their respective longitudinal axis and a longitudinal axis of the first port cage, and are inverted relative to each other.

15. The method of claim 14, wherein a plurality of device chassis mounting members extend from at least one of second port cages and the third port cages and are mounted to a device chassis.

16. The method of claim 14, wherein a respective port connector is included in the first port cage, each of the pair of second port cages, and each of the pair of third port cages, and wherein the method further comprises:
   transmitting, by a respective board cable extending between a board and the respective port connector included in the first port cage, each of the pair of second port cages, and each of the pair of third port cages, data with the first cabling system, the second cabling system, and the third cabling system.

17. The method of claim 14, wherein a first of each of the pair of second port cages and the pair of third port cages is angled relative to the first port cage by the same angle between their respective longitudinal axis and the longitudinal axis of the first port cage but in opposite directions, and wherein a second of each of the pair of second port cages and the pair of third port cages is angled relative to the first port cage by the same angle between their respective longitudinal axis and the longitudinal axis of the first port cage but in opposite directions.

18. The method of claim 14, wherein each of the second port cages and the third port cages includes opposing side surfaces, and wherein a respective structural support element extends between adjacent side surfaces on adjacent first and second port cages.

19. The method of claim 14, wherein the first cabling system is coupled to the first port cage, each of the second cabling systems is coupled to each of the pair of second ports cages, and each of the third cabling systems is coupled to each of the pair of third port cages, by a respective Quad Small Form-factor Pluggable (QSFP) transceiver device.

20. The method of claim 14, further comprising:

transmitting, by a plurality of airflow apertures defined by a device chassis adjacent the first port cage, each of the pair of second port cages, and each of the pair of third port cages, an airflow.

* * * * *